(12) United States Patent
MacPherson et al.

(10) Patent No.: US 7,923,276 B2
(45) Date of Patent: Apr. 12, 2011

(54) PROCESSES FOR FORMING ELECTRONIC DEVICES INCLUDING SPACED-APART RADIATION REGIONS

(75) Inventors: Charles Douglas MacPherson, Santa Barbara, CA (US); Gordana Srdanov, Santa Barbara, CA (US); Gang Yu, Santa Barbara, CA (US)

(73) Assignees: E. I. du Pont de Nemours and Company, Wilmington, DE (US); Company Dupont Displays Inc, Wilmington, DE (US)

( * ) Notice: Subject to any disclaimer, the term of this patent is extended or adjusted under 35 U.S.C. 154(b) by 0 days.

(21) Appl. No.: 12/846,979

(22) Filed: Jul. 30, 2010

(65) Prior Publication Data
US 2010/0291721 A1 Nov. 18, 2010

Related U.S. Application Data

(62) Division of application No. 11/644,751, filed on Dec. 22, 2006, now Pat. No. 7,795,653.

(60) Provisional application No. 60/754,961, filed on Dec. 27, 2005.

(51) Int. Cl.
*H01L 21/00* (2006.01)
(52) U.S. Cl. .................................. 438/34; 257/E33.001
(58) Field of Classification Search .................... 438/34; 257/E33.001
See application file for complete search history.

(56) References Cited

U.S. PATENT DOCUMENTS

| | | | | |
|---|---|---|---|---|
| 4,356,429 | A | 10/1982 | Tang | 313/503 |
| 4,539,507 | A | 9/1985 | VanSlyke et al. | 313/504 |
| 4,632,514 | A | 12/1986 | Ogawa et al. | 350/339 |
| 5,247,190 | A | 9/1993 | Friend et al. | 257/40 |
| 6,459,199 | B1 | 10/2002 | Kido et al. | 313/504 |
| 2001/0019782 | A1 | 9/2001 | Igarashi et al. | 428/690 |
| 2002/0121638 | A1 | 9/2002 | Grushin et al. | 257/40 |
| 2004/0179165 | A1 | 9/2004 | Kinoshita et al. | 349/158 |
| 2004/0260090 | A1 | 12/2004 | Treacher et al. | 544/224 |
| 2006/0144276 | A1 | 7/2006 | MacPherson et al. | 101/485 |

FOREIGN PATENT DOCUMENTS

| | | |
|---|---|---|
| EP | 1 191 612 A2 | 3/2002 |
| EP | 1 191 614 A2 | 3/2002 |
| WO | WO 02/02714 A2 | 1/2002 |
| WO | WO 02/15645 A1 | 2/2002 |
| WO | WO 02/31896 A2 | 4/2002 |

*Primary Examiner* — Thanh V Pham
*Assistant Examiner* — Mark A Laurenzi, III
(74) *Attorney, Agent, or Firm* — John H. Lamming

(57) ABSTRACT

Processes for forming an electronic device include forming a first radiation region, a second radiation region spaced apart from the first radiation region, and an insulating region. The insulating region can have a first side and a second side opposite the first side. The first radiation region can lie immediately adjacent to the first side, and the second radiation region can lie immediately adjacent to the second side. Within the insulating region, no other radiation region may lie between the first and second radiation regions, and the insulating region can include an insulating layer that includes a plurality of openings. A process for forming the electronic device can include patterning an insulating layer.

11 Claims, 10 Drawing Sheets

US 7,923,276 B2

PROCESSES FOR FORMING ELECTRONIC DEVICES INCLUDING SPACED-APART RADIATION REGIONS

CROSS REFERENCE TO RELATED APPLICATIONS

This application is a division of U.S. application Ser. No. 11/644,751, filed Dec. 22, 2006, now allowed, which claims benefit of priority under 35 U.S.C. §119(e) from Provisional Application No. 60/754,961, filed Dec. 27, 2005, which is incorporated by reference in its entirety.

BACKGROUND INFORMATION

1. Field of the Disclosure

The disclosure relates generally to electronic devices, and more specifically, to electronic devices including spaced-apart radiation regions and processes for forming the same.

2. Description of the Related Art

Electronic devices, including organic electronic devices, continue to be more extensively used in everyday life. Examples of organic electronic device include Organic Light-Emitting Diodes ("OLEDs"). Manufacture of such devices can require control over the spreading of deposited liquid compositions. Typically, this has been accomplished by the use of an organic or inorganic material deposited over a panel to form a bank structure to help prevent the flow of the liquid composition into undesirable areas. The bank could be fluorinated to improve the confinement through an increased contact angle and reduced surface energy.

Alternative methods have been used in which a receiving layer is use to rapidly increase the viscosity of a deposited liquid composition, and therefore, reduce the spreading of the liquid composition laterally and help to prevent overflow into neighboring pixels. The receiving layer can be formed by spin-coating material over the surface of the workpiece prior to placement of the liquid composition. The receiving layer can help reduce possible negative interactions between the liquid composition and the surface of the workpiece and may eliminate the need for a plasma surface treatment prior to application of the liquid composition.

However, for resolution greater than approximately 100 pixels per square inch, a thicker receiving layer may be required to achieve the needed control in line width. An increase in receiver layer thickness could negatively impact both the efficiency and operating voltage of the display if the receiving layer reduces the electrical, optical, or any combination thereof, properties of the emission materials. The uniformity of the diffusion of the deposited liquid composition into the receiver layer can also be difficult to control and cause visual differences across the panel. Such visual differences can be the result of emission of a different spectrum or intensity from portions of the panel designed to be the same. Adjusting for these differences can use a portion of the adjustment range that could otherwise be used to extend the usable life of the electronic component.

A different conventional process uses a vapor or solid phase diffusion process. Both processes suffer from similar problems previously described. If the diffusion is long enough to make the concentration of a deposited material more uniform throughout a thickness of the layer (i.e., reduce the concentration gradient between the electrodes), lateral diffusion will be too large and can result in low resolution because the pixels will need to be large. Alternatively, if lateral diffusion can be kept at an acceptable level for high resolution, the guest material concentration gradient throughout the thickness of the organic layer may be unacceptably large. In some instances, both problems may occur (i.e., unacceptably large lateral diffusion while having too severe of a concentration gradient between the electrodes of the electronic device).

SUMMARY

An electronic device can include a first radiation region, a second radiation region spaced apart from the first radiation region, and an insulating region. The insulating region can have a first side and a second side opposite the first side. The first radiation region can lie immediately adjacent to the first side, and the second radiation region can lie immediately adjacent to the second side. Within the insulating region, no other radiation region may lie between the first and second radiation regions, and the insulating region can include an insulating layer that includes a plurality of openings. In one embodiment, the electronic device can also include a first spectral layer including a first portion and a second portion. The first portion of the first spectral layer can lie within the first radiation region, and the second portion of the first spectral layer can lie within a first opening of the insulating layer wherein the plurality of openings includes the first opening. From a plan view, the first spectral layer can overlie only a portion of the insulating layer within the insulating region.

In another aspect, a process for forming the electronic device can include patterning an insulating layer. The patterned insulating layer can define a plurality of openings within the insulating layer. A first opening and a second opening of the plurality of openings can lie within the insulating region, wherein the insulating region having a first side and a second side opposite the first side. A first radiation region can lie immediately adjacent to the first side, and a second radiation region can lie immediately adjacent to the second side. Within the insulating region, no other radiation region may lie between the first and the second radiation regions. The process can also include forming a first liquid composition at a first location overlying a substrate, such that the first liquid composition includes a first portion and a second portion. The first portion of the first liquid composition can lie within the first radiation region, and the second portion of the first liquid composition can substantially fill the first opening of the plurality of openings. Substantially none of the first liquid composition may be formed within a second opening of the plurality of openings.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

Figure 1:
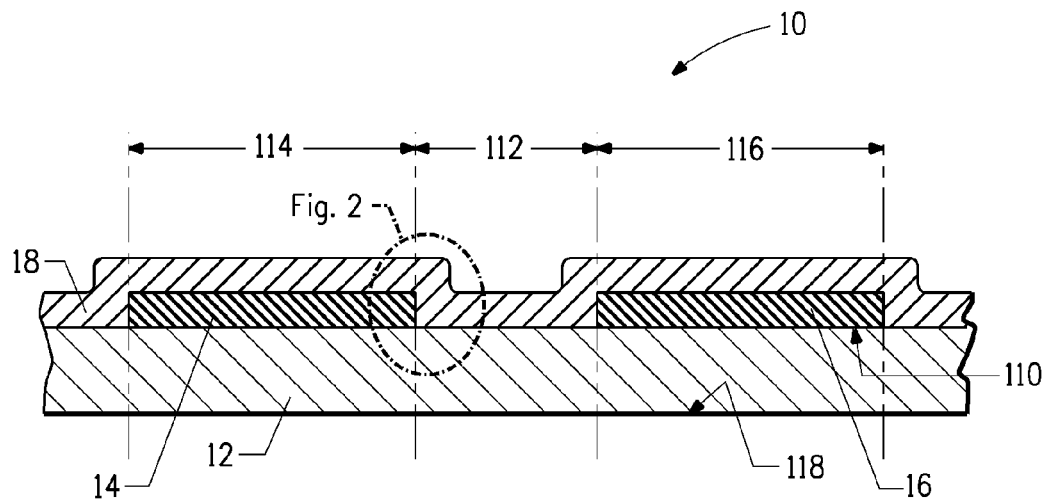
FIG. 1 includes an illustration of a cross-sectional view of a workpiece including a substrate, first electrodes, and an insulating layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

In a first aspect, an electronic device can include a first radiation region, a second radiation region spaced apart from the first radiation region, and an insulating region. The insulating region can have a first side and a second side opposite the first side. The first radiation region can lie immediately adjacent to the first side, and the second radiation region can lie immediately adjacent to the second side. Within the insulating region, no other radiation region may lie between the first and second radiation regions, and the insulating region can include an insulating layer that includes a plurality of openings. The electronic device can also include a first spectral layer including a first portion and a second portion. The first portion of the first spectral layer can lie within the first radiation region, and the second portion of the first spectral layer lies within a first opening of the insulating layer, wherein the plurality of openings includes the first opening. From a plan view, the first spectral layer can overlie only a portion of the insulating layer within the insulating region.

In one embodiment of the first aspect, the plurality of openings forms a regular pattern. In another embodiment, each opening within the plurality of openings includes substantially a same size, a same shape, or any combination thereof.

In still another embodiment of the first aspect, the first radiation region further includes a portion of the insulating layer. In a particular embodiment, within the first radiation region, at least a part of the first portion of the first spectral layer lies within a second opening of the plurality of openings. In a more particular embodiment, the first radiation region further includes a conductive member overlying the insulating layer. In another more particular embodiment, the first radiation region further includes a conductive member, and wherein the insulating layer overlies the conductive member.

In yet another embodiment of the first aspect, a third opening of the plurality of openings includes a channel. In a particular embodiment, from a plan view, the channel changes direction at least once along a length of the channel. In another embodiment, the first spectral layer includes an organic active layer. In still another embodiment, the electronic device can further include a second spectral layer including a first portion and a second portion. The first portion of the second spectral layer lies within the second radiation region. The second portion of the second spectral layer lies within a second opening of the insulating layer, wherein the plurality of openings includes the second opening. From a plan view, the second spectral layer overlies only a portion of the insulating layer within the insulating region. In yet another embodiment, the insulating layer includes an oxide, a nitride, or any combination thereof.

In a second aspect, a process for forming an electronic device can include patterning an insulating layer. The patterned insulating layer can define a plurality of openings within the insulating layer. A first opening and a second opening of the plurality of openings can lie within the insulating region, the insulating region having a first side and a second side opposite the first side. A first radiation region can lie immediately adjacent to the first side, and a second radiation region can lie immediately adjacent to the second side. Within the insulating region, no other radiation region may lie between the first and the second radiation regions. The process can also include forming a first liquid composition at a first location overlying a substrate, wherein the first liquid composition can include a first portion and a second portion. The first portion of the first liquid composition can lie within the first radiation region, and the second portion of the first liquid composition can substantially fill the first opening of the plurality of openings. Substantially none of the first liquid composition may be formed within the second opening of the plurality of openings.

In one embodiment of the second aspect, during formation of the first liquid composition, a thickness of the first liquid composition layer is at least four times a depth of the first opening. In another embodiment, the process can further include forming a second liquid composition at a second location overlying the substrate, such that the second liquid composition substantially fills a third opening of the plurality of openings.

In a particular embodiment, a portion of the patterned insulating layer including the second opening lies between the first location and the second location. In a more particular embodiment, substantially none of the second liquid composition is formed within the second opening.

In another embodiment of the second aspect, forming the first liquid composition includes continuously printing the first liquid composition. In a particular embodiment, the first liquid composition includes a spectral material. In another embodiment, patterning the insulating layer further includes forming at least one opening extending through the insulating layer.

Many aspects and embodiments have been described above and are merely exemplary and not limiting. After reading this specification, skilled artisans appreciate that other aspects and embodiments are possible without departing from the scope of the invention.

Other features and advantages of the invention will be apparent from the following detailed description, and from the claims. The detailed description first addresses Definitions and Clarification of Terms followed by Liquid Compositions, Fabrication Before Organic Active Layer Formation, Formation of Organic Layer(s), Remainder of Fabrication, Alternative Embodiments, Advantages, and finally Examples.

1. Definitions and Clarification of Terms

Before addressing details of embodiments described below, some terms are defined or clarified. The terms "array," "peripheral circuitry," and "remote circuitry" are intended to mean different areas or components of an electronic device. For example, an array may include pixels, cells, or other structures within an orderly arrangement (usually designated by columns and rows). The pixels, cells, or other structures within the array may be controlled by peripheral circuitry, which may lie on the same substrate as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "channel" when referring to an opening is intended to mean such opening has a length that is significantly greater than its width.

The term "change direction," when referring to a channel, is intended to mean that along a length of the channel, which is a line defined by the center of the width of the channel, is not a straight line.

The term "conductive," when referring to a layer, material, member, or structure, is intended to mean such layer, material, member, or structure is not insulating.

The term "continuous" and its variants are intended to mean substantially unbroken. In one embodiment, continuously printing is printing using a substantially unbroken stream of a liquid or a liquid composition, as opposed to a depositing technique using drops. In another embodiment, extending continuously refers to a length of a layer, member, or structure in which no significant breaks in the layer, member, or structure lie along its length.

The term "electronic component" is intended to mean a lowest level unit of a circuit that performs an electrical or electro-radiative (e.g., electro-optic) function. An electronic component may include a transistor, a diode, a resistor, a capacitor, an inductor, a semiconductor laser, an optical switch, or the like. An electronic component does not include parasitic resistance (e.g., resistance of a wire) or parasitic capacitance (e.g., capacitive coupling between two conductors electrically connected to different electronic components where a capacitor between the conductors is unintended or incidental).

The term "electronic device" is intended to mean a collection of circuits, electronic components, or combinations thereof that collectively, when properly electrically connected and supplied with the appropriate potential(s), performs a function. An electronic device may include or be part of a system. An example of an electronic device includes a display, a sensor array, a computer system, an avionics system, an automobile, a cellular phone, other consumer or industrial electronic product, or any combination thereof.

The term "elevation" is intended to mean a distance from a primary surface of a substrate as measured in a direction perpendicular to the primary surface.

The term "hole" is intended to mean a penetration into a surface, as formed by a removal process. A hole may extend partially or completely through a layer of substrate.

The term "insulating" and its variants are intended to mean a layer, material, member, or structure having an electrical property such that (1) it has a significant associated voltage drop across or through such layer, material, member, or structure or (2) it substantially prevents a significant number of charge carriers from flowing through such material, layer, member or structure. For example, an insulating material has a bulk resistivity no lower than $10^{-2}$ ohm-cm.

The term "layer" is intended to mean a substrate or a film overlying a substrate.

The term "liquid composition" is intended to mean a liquid medium in which a material is dissolved to form a solution, a liquid medium in which a material is dispersed to form a dispersion, or a liquid medium in which a material is suspended to form a suspension or an emulsion.

The term "liquid medium" is intended to mean a liquid material, including a pure liquid, a combination of liquids, a solution, a dispersion, a suspension, and an emulsion. Liquid medium is used regardless whether one or more solvents are present.

The term "opening" is intended to mean a depression in the workpiece surface corresponding to a hole at a particular point in the fabrication process. When a hole is first formed, an opening and a hole are the same. A layer may partially, but not completely fill a hole. The hole does not change, but the remaining portion of the hole that is not occupied by the layer is now the opening.

The term "organic active layer" is intended to mean one or more organic layers, wherein at least one of the organic layers, by itself, or when in contact with a dissimilar material is capable of forming a rectifying junction.

The term "organic layer" is intended to mean one or more layers, wherein at least one of the insulating layers comprises a material including carbon and at least one other element, such as hydrogen, oxygen, nitrogen, fluorine, etc.

The term "pixel" is intended to mean the smallest complete, repeating unit of an array. The term "subpixel" is intended to mean a portion of a pixel that makes up only a part, but not all, of a pixel. In a full-color display, a full-color pixel can comprise three sub-pixels with primary colors in red, green and blue spectral regions. A monochromatic display may include pixels but no subpixels. A sensor array can include pixels that may or may not include subpixels.

The term "primary surface" is intended to mean a surface of a substrate from which an electronic component is subsequently formed.

The term "radiation-emitting component" is intended to mean an electronic component, which when properly biased, emits radiation at a targeted wavelength or spectrum of wavelengths. The radiation may be within the visible-light spectrum or outside the visible-light spectrum (UV or IR). A light-emitting diode is an example of a radiation-emitting component.

The term "radiation region" is intended to mean a region that includes a radiation-emitting component, a radiation-responsive component, or a layer, member, or structure that changes the quality of radiation passing through such layer, member, or structure (e.g., a radiation filter layer). The radiation may be within the visible-light spectrum or outside the visible-light spectrum (UV or IR). A radiation region can correspond to a pixel or sub-pixel of an electronic device.

The term "radiation-responsive component" is intended to mean an electronic component, which when properly biased, can respond to radiation at a targeted wavelength or spectrum of wavelengths. The radiation may be within the visible-light spectrum or outside the visible-light spectrum (UV or IR). An IR sensor and a photovoltaic cell are examples of radiation-sensing components.

The term "rectifying junction" is intended to mean a junction within a semiconductor layer or a junction formed by an interface between a semiconductor layer and a dissimilar material, in which charge carriers of one type flow easier in one direction through the junction compared to the opposite direction. A p-n junction is an example of a rectifying junction that can be used as a diode.

The term "regular pattern" is intended to mean an orderly arrangement of features and spaces between the features, wherein along at least one direction, each of the features are substantially the same size and shape and the spaces between the features are substantially the same distance. In one embodiment, the regular pattern may extend in more than one direction, such as along a vertical direction and a horizontal direction, along different diagonal directions, or any combination thereof.

The term "spectral," with respect to a layer or material, is intended to mean that such layer or material can emit, respond to, or filter radiation at a targeted wavelength or spectrum of wavelengths.

The term "spectrum" is intended to mean more than one wavelength. Spectrum can correspond to one or more ranges of wavelengths. The ranges can be contiguous, overlapping, spaced apart, or any combination thereof.

The term "substrate" is intended to mean a base material that can be either rigid or flexible and may include one or more layers of one or more materials, which can include, but are not limited to, glass, polymer, metal or ceramic materials or combinations thereof. The reference point for a substrate is the beginning point of a process sequence. The substrate may or may not include electronic components, circuits, or conductive members. The term "user surface" is intended to mean a surface of the electronic device principally used during normal operation of the electronic device. In the case of a display, the surface of the electronic device seen by a user would be a user surface. In the case of a sensor or photovoltaic cell, the user surface would be the surface that principally transmits radiation that is to be sensed or converted to electrical energy. Note that an electronic device may have more than one user surface.

The term "visible light spectrum" is intended to mean a radiation spectrum having wavelengths corresponding to 400 to 700 nm.

The term "workpiece" is intended to mean a substrate, or if one or more layers, members, or structures are present, a combination of such substrate and such one or more layers, members, or structures at any particular point of a process sequence. Note that the substrate may not significantly change during a process sequence, whereas the workpiece significantly changes during the process sequence. For example, at a beginning of a process sequence, the substrate and workpiece are the same. After a layer is formed over the substrate, the substrate has not changed, but now the workpiece includes the substrate and the layer.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise. Group numbers corresponding to columns within the periodic table of the elements use the "New Notation" convention as seen in the CRC Handbook of Chemistry and Physics, $81^{st}$ Edition (2000).

Unless otherwise defined, all technical and scientific terms used herein have the same meaning as commonly understood by one of ordinary skill in the art to which this invention belongs. Although suitable methods and materials are described herein for embodiments of the invention, or methods for making or using the same, other methods and materials similar or equivalent to those described can be used without departing from the scope of the invention. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the organic light-emitting diode display, photodetector, photovoltaic, and semiconductor arts.

2. Liquid Compositions

Liquid compositions, continuous printing apparatuses, and methods of using liquid compositions and continuous printing apparatuses are described in more detail in U.S. patent application Ser. No. 11/027,133, entitled "Electronic Devices and Processes For Forming the Same" by MacPherson et al., filed on Dec. 30, 2004. In addition to continuous printing apparatuses, other apparatuses, such as ink jet printers, spin coaters, etc. can be used to deposit or otherwise form liquid compositions over substrates.

The liquid composition can be in the form of a solution, dispersion, emulsion, or suspension. In the paragraphs that follow, non-limiting examples of solid materials and liquid medium are given. The solid material(s) can be selected based upon the electronic or electro-radiative properties for a subsequently formed layer. The liquid medium can be selected based on criteria described later in this specification.

An organic layer printed using a printing apparatus (e.g., an ink-jet printing apparatus, a continuous printing apparatus, another suitable selective liquid depositing apparatus, or any combination thereof) can include an organic active layer (e.g., a radiation-emitting organic active layer or a radiation-responsive organic active layer), filter layer, buffer layer, charge-injecting layer, charge-transport layer, charge-blocking layer, or any combination thereof. The organic layer may be used as part of a resistor, transistor, capacitor, diode, etc.

For a radiation-emitting organic active layer, suitable radiation-emitting materials include one or more small molecule materials, one or more polymeric materials, or a combination thereof. A small molecule material may include any one or more of those described in, for example, U.S. Pat. No. 4,356,429 ("Tang"); U.S. Pat. No. 4,539,507 ("Van Slyke"); U.S. Patent Application Publication No. US 2002/0121638 ("Grushin"); or U.S. Pat. No. 6,459,199 ("Kido"). Alternatively, a polymeric material may include any one or more of those described in U.S. Pat. No. 5,247,190 ("Friend"); U.S. Pat. No. 5,408,109 ("Heeger"); or U.S. Pat. No. 5,317,169 ("Nakano"). An exemplary material is a semiconducting conjugated polymer. An example of such a polymer includes poly(paraphenylenevinylene) (PPV), a PPV copolymer, a polyfluorene, a polyphenylene, a polyacetylene, a polyalkylthiophene, poly(n-vinylcarbazole) (PVK), or the like. For a radiation-responsive organic active layer, a suitable radiation-responsive material may include many a conjugated polymer or an electroluminescent material. Such a material includes, for example, a conjugated polymer or an electro- and photo-luminescent material. A specific example includes poly(2-methoxy,5-(2-ethyl-hexyloxy)-1,4-phenylene vinylene) ("MEH-PPV") or a MEH-PPV composite with CN-PPV.

The location of a filter layer may be between an organic active layer and a user side of the electronic device. A filter layer may be part of a substrate, an electrode, an anode or a cathode), a charge-transport layer, a charge-injecting layer, a charge-blocking layer; the filter layer may lie between any one or more of the substrate, an electrode, a charge-transport layer, a charge-injecting layer, a charge-blocking layer, or any combination thereof. In another embodiment, the filter layer may be a layer that is fabricated separately (while not attached to the substrate) and later attached to the substrate at any time before, during, or after fabricating the electronic components within the electronic device. In this embodiment, the filter layer may lie between the substrate and a user of the electronic device.

When the filter layer is separate from or part of the substrate, or when the filter lies between the substrate and an electrode closest to the substrate, a suitable material includes an organic material including a polyolefin (e.g., polyethylene or polypropylene); a polyester (e.g., polyethylene terephthalate or polyethylene naphthalate); a polyimide; a polyamide; a polyacrylonitrile or a polymethacrylonitrile; a perfluorinated or partially fluorinated polymer (e.g., polytetrafluoroethylene or a copolymer of tetrafluoroethylene and polystyrene); a polycarbonate; a polyvinyl chloride; a polyurethane; a polyacrylic resin, including a homopolymer or a copolymer of an ester of an acrylic or methacrylic acid; an epoxy resin; a Novolac resin; or any combination thereof.

For a hole-injecting layer, hole-transport layer, electron-blocking layer, or any combination thereof, a suitable material includes polyaniline ("PANI"), poly(3,4-ethylenedioxythiophene) ("PEDOT"), polypyrrole, an organic charge transfer compound, such as tetrathiafulvalene tetracyanoquinodimethane ("TTF-TCQN"), a hole-transport material as described in Kido, or any combination thereof.

For an electron-injecting layer, electron transport layer, hole-blocking layer, or any combination thereof, a suitable material includes a metal-chelated oxinoid compound (e.g., tris-(8-hydroxyquinoline) aluminum ("Alq$_3$"), bis-(2-methyl-8-quinolate)-4-(phenylphenolato)-aluminum ("BAlq"), zirconium 8-hydroxyquinoline ("Zrq$_4$")); a phenanthroline-based compound (e.g., 2,9-dimethyl-4,7-diphenyl-1,10-phenanthroline ("DDPA") or 9,10-diphenylanthracence ("DPA")); an azole compound (e.g., 2-tert-butylphenyl-5-biphenyl-1,3,4-oxadiazole ("PBD") or 3-(4-biphenyl)-4-phenyl-5-(4-t-butylphenyl)-1,2,4-triazole ("TAZ"); an electron transport material as described in Kido; a diphenylanthracene derivative; a dinaphthylanthracene derivative; 4,4-bis(2,2-diphenyl-ethen-1-yl)-biphenyl ("DPVBI"); 9,10-di-beta-naphthylanthracene; 9,10-di-(naphenthyl)anthracene; 9,10-di-(2-naphthyl)anthracene ("ADN"); 4,4'-bis(carbazol-9-yl)biphenyl ("CBP"); 9,10-bis-[4-(2,2-diphenylvinyl)-phenyl]-anthracene ("BD-PVPA"); anthracene, N-arylbenzimidazoles (such as "TPBI"); 1,4-bis[2-(9-ethyl-3-carbazoyl)vinylenyl]benzene; 4,4'-bis[2-(9-ethyl-3-carbazoyl)vinylenyl]-1,1'-biphenyl; 9,10-bis[2,2-(9,9-fluorenylene)vinylenyl]anthracene; 1,4-bis[2,2-(9,9-fluorenylene)vinylenyl]benzene; 4,4'-bis[2,2-(9,9-fluorenylene)vinylenyl]-1,1'-biphenyl; perylene, substituted perylenes; tetra-tert-butylperylene ("TBPe"); bis(3,5-difluoro-2-(2-pyridyl)phenyl-(2-carboxypyridyl)) iridium III ("F(Ir)Pic"); a pyrene, a substituted pyrene; a styrylamine; a fluorinated phenylene; oxidazole; 1,8-naphthalimide; a polyquinoline; one or more carbon nanotubes within PPV; or any combination thereof.

For an electronic component, such as a resistor, transistor, capacitor, etc., the organic layer may include one or more of thiophenes (e.g., polythiophene, poly(alkylthiophene), alkylthiophene, bis(dithienthiophene), alkylanthradithiophene, etc.), polyacetylene, pentacene, phthalocyanine, or any combination thereof.

An example of an organic dye includes 4-dicyanmethylene-2-methyl-6-(p-dimethyaminostyryl)-4H-pyran (DCM), coumarin, pyrene, perylene, rubrene, a derivative thereof, or any combination thereof.

An example of an organometallic material includes a functionalized polymer comprising one or more functional groups coordinated to at least one metal. An exemplary functional group contemplated for use includes a carboxylic acid, a carboxylic acid salt, a sulfonic acid group, a sulfonic acid salt, a group having an OH moiety, an amine, an imine, a diimine, an N-oxide, a phosphine, a phosphine oxide, a β-dicarbonyl group, or any combination thereof. An exemplary metal contemplated for use includes a lanthanide metal (e.g., Eu, Tb), a Group 7 metal (e.g., Re), a Group 8 metal (e.g., Ru, Os), a Group 9 metal (e.g., Rh, Ir), a Group 10 metal (e.g., Pd, Pt), a Group 11 metal (e.g., Au), a Group 12 metal (e.g., Zn), a Group 13 metal (e.g., Al), or any combination thereof. Such an organometallic material includes a metal chelated oxinoid compound, such as tris(8-hydroxyquinolato)aluminum (Alq$_3$); a cyclometalated iridium or platinum electroluminescent compound, such as a complex of iridium with phenylpyridine, phenylquinoline, or phenylpyrimidine ligands as disclosed in published PCT Application WO 02/02714, an organometallic complex described in, for example, published applications US 2001/0019782, EP 1191612, WO 02/15645, WO 02/31896, and EP 1191614; or any mixture thereof.

An example of a conjugated polymer includes a poly(phenylenevinylene), a polyfluorene, a poly(spirobifluorene), a copolymer thereof, or any combination thereof.

Selecting a liquid medium can also be an important factor for achieving one or more proper characteristics of the liquid composition. A factor to be considered when choosing a liquid medium includes, for example, viscosity of the resulting solution, emulsion, suspension, or dispersion, molecular weight of a polymeric material, solids loading, type of liquid medium, boiling point of the liquid medium, temperature of an underlying substrate, thickness of an organic layer, or any combination thereof.

In some embodiments, the liquid medium includes at least one solvent. An exemplary organic solvent includes a halogenated solvent, a colloidal-forming polymeric acid, a hydrocarbon solvent, an aromatic hydrocarbon solvent, an ether solvent, a cyclic ether solvent, an alcohol solvent, a glycol solvent, a ketone solvent, a nitrile solvent, a sulfoxide solvent, an amide solvent, an ester solvent, or any combination thereof.

An exemplary halogenated solvent includes carbon tetrachloride, methylene chloride, chloroform, tetrachloroethylene, chlorobenzene, bis(2-chloroethyl)ether, chloromethyl ethyl ether, chloromethyl methyl ether, 2-chloroethyl ethyl ether, 2-chloroethyl propyl ether, 2-chloroethyl methyl ether, or any combination thereof.

An exemplary colloid-forming polymeric acid includes a fluorinated sulfonic acid (e.g., fluorinated alkylsulfonic acid, such as perfluorinated ethylenesulfonic acid) or any combinations thereof.

An exemplary hydrocarbon solvent includes pentane, hexane, cyclohexane, heptane, octane, decahydronaphthalene, a petroleum ether, ligroine, or any combination thereof.

An exemplary aromatic hydrocarbon solvent includes benzene, naphthalene, toluene, xylene, ethyl benzene, diethyl benzene, cumene (iso-propyl benzene), mesitylene (trimethyl benzene), ethyl toluene, butyl benzene, cymene (iso-propyl toluene), diethylbenzene, iso-butyl benzene, tetramethyl benzene, sec-butyl benzene, tert-butyl benzene, anisole, 4-methylanisole, 3,4-dimethylanisole, decyl benzene, another alkyl benzene, or any combination thereof.

An exemplary ether solvent includes diethyl ether, ethyl propyl ether, dipropyl ether, diisopropyl ether, dibutyl ether, methyl t-butyl ether, glyme, diglyme, benzyl methyl ether, isochroman, 2-phenylethyl methyl ether, n-butyl ethyl ether, 1,2-diethoxyethane, sec-butyl ether, diisobutyl ether, ethyl n-propyl ether, ethyl isopropyl ether, n-hexyl methyl ether, n-butyl methyl ether, methyl n-propyl ether, or any combination thereof.

An exemplary cyclic ether solvent includes tetrahydrofuran, dioxane, tetrahydropyran, 4 methyl-1,3-dioxane, 4-phenyl-1,3-dioxane, 1,3-dioxolane, 2-methyl-1,3-dioxolane, 1,4-dioxane, 1,3-dioxane, 2,5-dimethoxytetrahydrofuran, 2,5-dimethoxy-2,5-dihydrofuran, or any combination thereof.

An exemplary alcohol solvent includes methanol, ethanol, 1-propanol, 2-propanol, 1-butanol, 2-butanol, 2-methyl-1-propanol (i.e., iso-butanol), 2-methyl-2-propanol (i.e., tert-butanol), 1-pentanol, 2-pentanol, 3-pentanol, 2,2-dimethyl-1-propanol, 1-hexanol, cyclopentanol, 3-methyl-1-butanol, 3-methyl-2-butanol, 2-methyl-1-butanol, 2,2-dimethyl-1-propanol, 3-hexanol, 2-hexanol, 4-methyl-2-pentanol, 2-methyl-1-pentanol, 2-ethylbutanol, 2,4-dimethyl-3-pentanol, 3-heptanol, 4-heptanol, 2-heptanol, 1-heptanol, 2-ethyl-1-hexanol, 2,6-dimethyl-4-heptanol, 2-methylcyclohexanol, 3-methylcyclohexanol, 4-methylcyclohexanol, or any combination thereof.

An alcohol ether solvent may also be employed. An exemplary alcohol ether solvent includes 1-methoxy-2-propanol, 2-methoxyethanol, 2-ethoxyethanol, 1-methoxy-2-butanol, ethylene glycol monoisopropyl ether, 1-ethoxy-2-propanol, 3-methoxy-1-butanol, ethylene glycol monoisobutyl ether, ethylene glycol mono-n-butyl ether, 3-methoxy-3-methylbutanol, ethylene glycol mono-tert-butyl ether, or any combination thereof.

An exemplary glycol solvent includes ethylene glycol, propylene glycol, propylene glycol monomethyl ether (PGME), dipropylene glycol monomethyl ether (DPGME), or any combination thereof.

An exemplary ketone solvent includes acetone, methylethyl ketone, methyl iso-butyl ketone, cyclohexanone, diethyl ketone, isopropyl methyl ketone, 2-pentanone, 3-pentanone, 3-hexanone, diisopropyl ketone, 2-hexanone, cyclopentanone, 4-heptanone, iso-amyl methyl ketone, 3-heptanone, 2-heptanone, 4-methoxy-4-methyl-2-pentanone, 5-methyl-3-heptanone, 2-methylcyclohexanone, diisobutyl ketone, 5-methyl-2-octanone, 3-methylcyclohexanone, 2-cyclohexen-1-one, 4-methylcyclohexanone, cycloheptanone, 4-tert-butylcyclohexanone, isophorone, benzyl acetone, or any combination thereof.

An exemplary nitrile solvent includes acetonitrile, acrylonitrile, trichloroacetonitrile, propionitrile, pivalonitrile, isobutyronitrile, n-butyronitrile, methoxyacetonitrile, 2-methylbutyronitrile, isovaleronitrile, N-valeronitrile, n-capronitrile, 3-methoxypropionitrile, 3-ethoxypropionitrile, 3,3'-oxydipropionitrile, n-heptanenitrile, glycolonitrile, benzonitrile, ethylene cyanohydrin, succinonitrile, acetone cyanohydrin, 3-n-butoxypropionitrile, or any combination thereof.

An exemplary sulfoxide solvent includes dimethyl sulfoxide, di-n-butyl sulfoxide, tetramethylene sulfoxide, methyl phenyl sulfoxide, or any combinations thereof.

An exemplary amide solvent includes dimethyl formamide, dimethyl acetamide, acylamide, 2-acetamidoethanol, N,N-dimethyl-m-toluamide, trifluoroacetamide, N,N-dimethylacetamide, N,N-diethyldodecanamide, epsilon-caprolactam, N,N-diethylacetamide, N-tert-butylformamide, formamide, pivalamide, N-butyramide, N,N-dimethylacetoacetamide, N-methyl formamide, N,N-diethylformamide, N-formylethylamine, acetamide, N,N-diisopropylformamide, 1-formylpiperidine, N-methylformanilide, or any combinations thereof.

Ester solvents can include alkyl esters of short chain carboxylic acids, alkyl esters of glycols, benzyl esters, di-ester solvents, dibasic esters, phenyl diesters, or any combination thereof. An exemplary ester solvent includes benzyl benzoate, butyl benzoate, dibutyl phthalate, dimethyl phthalate, dimethyl suberate, ethyl acetate, ethylene glycol diacetate, isobutyl acetate, isobutyl isobutyrate, methyl benzoate, or any combinations thereof.

A crown ether contemplated includes any one or more crown ethers that can function to assist in the reduction of the chloride content of an epoxy compound starting material as part of the combination being treated according to the invention. An exemplary crown ether includes benzo-15-crown-5; benzo-18-crown-6; 12-crown-4; 15-crown-5; 18-crown-6; cyclohexano-15-crown-5; 4',4"(5")-ditert-butyldibenzo-18-crown-6; 4',4"(5")-ditert-butyldicyclohexano-18-crown-6; dicyclohexano-18-crown-6; dicyclohexano-24-crown-8; 4'-aminobenzo-15-crown-5; 4'-aminobenzo-18-crown-6; 2-(aminomethyl)-15-crown-5; 2-(aminomethyl)-18-crown-6; 4'-amino-5'-nitrobenzo-15-crown-5; 1-aza-12-crown-4; 1-aza-15-crown-5; 1-aza-18-crown-6; benzo-12-crown-4; benzo-15-crown-5; benzo-18-crown-6; bis((benzo-15-crown-5)-15-ylmethyl)pimelate; 4-bromobenzo-18-crown-6; (+)-(18-crown-6)-2,3,11,12-tetra-carboxylic acid; dibenzo-18-crown-6; dibenzo-24-crown-8; dibenzo-30-crown-10; ar-ar'-di-tert-butyldibenzo-18-crown-6; 4'-formylbenzo-15-crown-5; 2-(hydroxymethyl)-12-crown-4; 2-(hydroxymethyl)-15-crown-5; 2-(hydroxymethyl)-18-crown-6; 4'-nitrobenzo-15-crown-5; poly-[(dibenzo-18-crown-6)-co-formaldehyde]; 1,1-dimethylsila-11-crown-4; 1,1-dimethylsila-14-crown-5; 1,1-dimethylsila-17-crown-5; cyclam; 1,4,10,13-tetrathia-7,16-diazacyclooctadecane; porphines; or any combinations thereof.

Skilled artisans will appreciate that some derivatives of the above mentioned solvents can also be used. For example, a halogen can be substituted for a hydrogen at a location of an above mentioned solvent, and the resulting chemical can still exhibit solvent properties.

In another embodiment, the liquid medium includes water. A conductive polymer complexed with a water-insoluble colloid-forming polymeric acid can be deposited over a substrate and used as a charge-transport layer.

Many different classes of liquid media (e.g., halogenated solvents, hydrocarbon solvents, aromatic hydrocarbon solvents, water, etc.) are described above. Mixtures of more than one example of a liquid medium from different classes may also be used.

The liquid composition may also include an inert material, such as a binder material, a filler material, or a combination thereof. With respect to the liquid composition, an inert material does not significantly affect the electronic, radiation emitting, or radiation responding properties of a layer that is formed by or receives at least a portion of the liquid composition.

3. Fabrication Before Organic Active Layer Formation

FIG. 1 includes an illustration of a cross-sectional view of a portion of a workpiece 10 after forming an insulating layer 18 over a substrate 12 of an insulating region 112, a first electrode 14 of a radiation region 114, and a first electrode 16 of a radiation region 116. The substrate 12 can be either rigid or flexible and may include one or more layers of one or more materials, which can include, but are not limited to, glass, polymer, metal or ceramic materials or combinations thereof. In one embodiment, the substrate 12 is substantially transparent to a targeted wavelength or spectrum of wavelengths associated with the electronic device. For example, the electronic device may emit radiation within the visible light spectrum, and thus, the substrate 12 would be transparent to radiation within the visible light spectrum. In another example, the electronic device may respond to infrared radiation, and thus the substrate 12 would be transparent to the infrared radiation. The substrate 12 can have a thickness in a range of from approximately 12 to approximately 2500 microns.

The substrate 12 includes a primary surface 110. The primary surface 110 can be a surface from which at least some of the electronic components for the electronic device may be fabricated. Although not illustrated, control circuits may lie within the substrate 12, wherein each control circuit would be electrically connected to a corresponding first electrode such as the first electrode 14 or 16. The electronic device can also have a user surface 118, which can be the surface of the electronic device seen by a user when using the electronic device, as designed.

First electrodes 14 and 16 are formed over the substrate 12, as illustrated in FIG. 1. In one embodiment, each of the first electrodes 14 and 16 can act as an anode for an electronic component, and thus includes one or more layers used as anodes within LCD or OLED displays. First electrodes 14 and 16 can be formed by a deposition using a conventional or proprietary technique. The first electrodes 14 and 16 may have a thickness in a range of approximately 10 nm to approximately 1000 nm. Other first electrodes for other electronic components are formed but are not illustrated in FIG. 1.

FIG. 1 includes the radiation region 114 and the radiation region 116. The radiation region 114 has sides that are substantially coterminous with sides of the first electrode 14 and extend in directions substantially perpendicular to the user surface 118. The radiation region 116 has sides that are substantially coterminous with sides of the first electrode 16 and extend in directions substantially perpendicular to the user surface 118. The insulating region 112 can lie between the radiation regions 114 and 116 with no other radiation region lying between the radiation regions 114 and 116. The insulating region 112 can have first and second opposing sides that lie immediately adjacent to the radiation regions 114 and 116, respectively.

In the embodiment as illustrated in FIG. 1, an insulating layer 18 can be formed over the workpiece 10. The insulating layer 18 can be an oxide, a nitride, an oxynitride, or any combination thereof. In one particular embodiment, if thermal conduction is needed or desired, the insulating layer 18 can include AlN or an epoxy resin (e.g., FR4). The thickness of the insulating layer 18 can be in a range of approximately 50 nm to approximately 1000 nm, and in a particular embodiment can be in a range of approximately 100 nm to approximately 400 nm. In another embodiment, the insulating layer 18 can be approximately one-third the thickness of the electrode 14. The insulating layer 18 can be formed by a conventional or proprietary technique.

Figure 2:
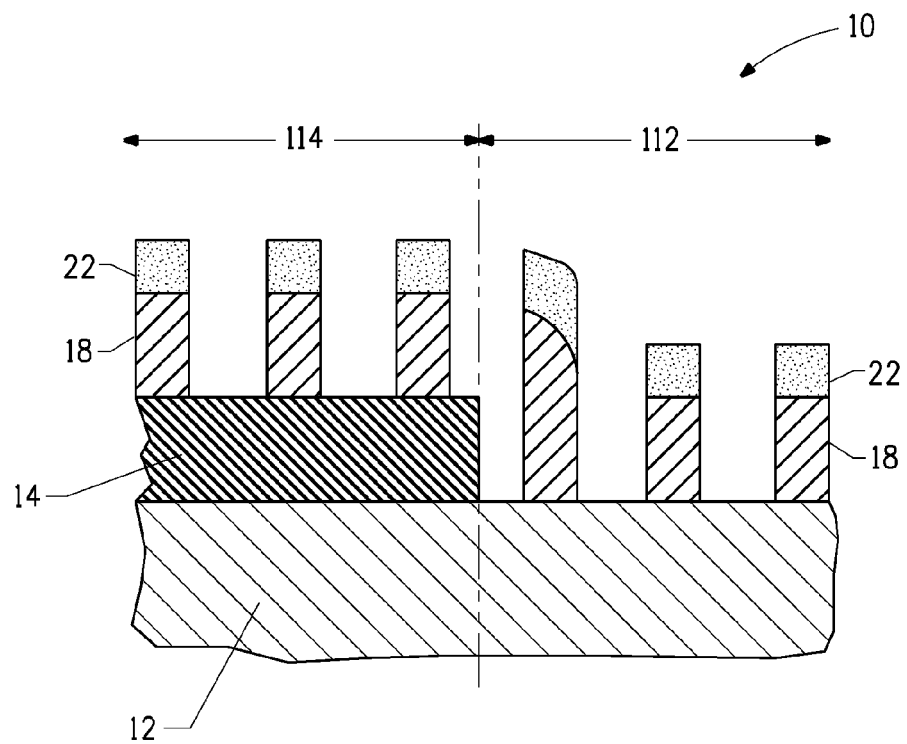
FIG. 2 includes an illustration of an enlarged cross-sectional view of a portion of the workpiece of FIG. 1 after forming a plurality of openings in the insulating layer and before removing the masking layer.

FIG. 2 illustrates the workpiece 10 of FIG. 1 after forming a patterned layer 22. FIG. 2 includes an enlarged portion of the workpiece 10 at a region as illustrated by the dashed circle 2 in FIG. 1. The patterned layer 22 is formed over workpiece 10 by one or more conventional or proprietary lithographic techniques. Exposed portions of the insulating layer 18 are then removed to form a plurality of openings in the insulating layer 18. In one embodiment an opening of the plurality of openings can extend through the insulating layer 18. In other embodiments, the opening of the plurality of openings may extend only partially through the insulating layer 18 and have a depth in a range of approximately 50 nm to approximately 1000 nm, and in a particular embodiment can be in a range of approximately 100 nm to approximately 400 nm. The plurality of openings described with respect to layer 18 is also a plurality of holes at this point in the process.

An opening of the plurality of openings can be within the insulating region 112, the radiation regions 114, the radiation region 116, or any combinations thereof. The plurality of openings can form a regular pattern. In one embodiment, the regular pattern can include openings and spaces between openings that appear as a rectangular grid. In another pattern, the regular pattern may appear as a honeycomb-like structure. In still another embodiment, the plurality of openings may form an irregular pattern.

In a particular embodiment, each of the openings of the plurality of openings can comprise substantially the same size and shape. In still another embodiment, the plurality of openings may include different sizes, different shapes, or any combinations thereof. In one embodiment, the size (e.g., diameter or width, as seen from a top view) may be no greater than approximately 5 microns. In another embodiment, the size may be no less than the lithographic limits used to form the plurality of openings, which lithographic limits may be in a range of approximately 0.3 to 4 microns. Regarding shape, nearly any shape can be used, such as a circle, oval, triangle, rectangle, pentagon, another suitable polygon, or the like. The shape may also include different sizes with one or more different lengths. After reading this specification, skilled artisans will appreciate that the openings, including depth, size and shape, and pattern of the openings, can be designed to meet the needs or desires for a particular application.

The density of the openings within the insulating layer 18 can affect the flow of a subsequently-deposited liquid composition. For example, as the density of openings within the insulating layer increases, the lateral flow of the liquid composition decreases. In one embodiment where lateral flow is desired, no openings or a relatively low density may be used. In another embodiment where lateral flow is not desired, a relatively higher density of openings may be used. In a particular embodiment, different densities of openings may be used to allow different lateral flows of the liquid composition for different regions.

In one embodiment, during processing, the insulating layer 18 and openings can overlie substantially all of the first electrode 14, 16 or both. In another embodiment, a portion of the insulating layer 18 can be removed to expose substantially all of the first electrode 14, or both 16. In such an embodiment, each of the first electrodes 14 and 16 can lie substantially exposed within a single opening of the plurality of openings. In another embodiment (described later in this specification), an opening of the plurality of openings can be a channel. The channel can help control liquid flow along the surface of the workpiece 10. A channel can be characterized by a width in a particular embodiment, wherein the channel is an opening with a length at least 3 times its width. In a particular embodiment, the channel changes direction at least once along the length. The change of direction may be in the form a sharp bend with at least one corner or as a continuous curve. Thus, a channel may or may not have a length lying along a straight line.

4. Formation of Organic Layer(s)

An organic layer can be formed over the first electrodes 14 and 16 and the substrate 12. The organic layer may include one or more layers. For example, the organic layer can include an organic active layer, a buffer layer, an electron-injection layer, an electron-transport layer, an electron-blocking layer, a hole-injection layer, a hole-transport layer, or a hole-blocking layer, or any combinations thereof. In one embodiment, the organic layer may include a first organic layer and organic active layers.

Any individual or combination of layers within the organic layer can be formed by a conventional or proprietary technique, including spin coating, casting, vapor depositing (chemical or physical), printing (ink jet printing, screen printing, solution dispensing (dispensing the liquid composition in strips or other predetermined geometric shapes or patterns, as seen from a plan view), or any combinations thereof), other depositing technique, or any combinations thereof for appropriate materials as described below. Any individual or combination of layers within the organic layer may be cured after deposition.

Figure 3:
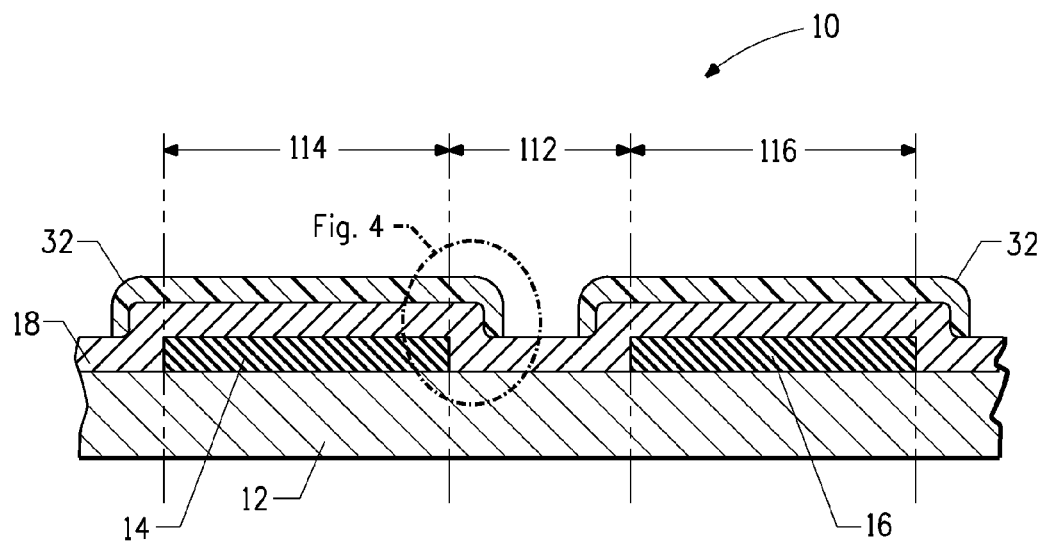
FIGS. 3 and 4 include illustrations of cross-sectional views of the workpiece of FIGS. 1 and 2 after forming a portion of an organic layer.
Figure 4:
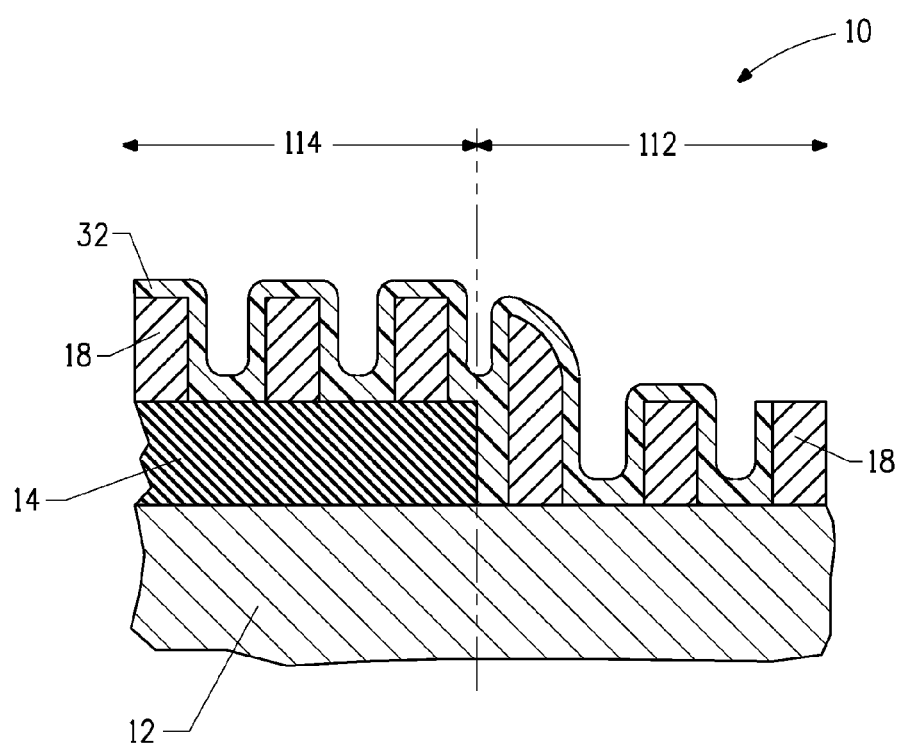

As illustrated in FIGS. 3 and 4, in an embodiment, an organic layer with one or more layers can be formed over and within openings of layer 18. FIG. 4 includes an enlarged portion of the workpiece 10 at a region as illustrated by the dashed circle 4 in FIG. 3. The organic layer can include a first organic layer 32. The first organic layer 32 can be formed by one or more embodiments previously described for forming organic layers. In one embodiment, the first organic layer 32 may include a conventional or proprietary material that is suitable for use in a buffer layer, as used in an OLED display. In another embodiment, the thickness of the first organic layer 32, after formation is completed, may have a thickness in a range of approximately 50 nm to approximately 300 nm, as measured over the substrate 12 at a location spaced apart from the first electrode 14. In still another embodiment, the first organic layer 32 may be thinner or thicker than the range recited above.

The first organic layer 32 can partially fill holes within the insulating layer 18 as illustrated in FIG. 4. The thickness of the first organic layer 32 may be thinner along walls of the holes within the insulating layer 18. While the shape of the holes within the insulating layer 18 does not change, the openings are now determined at least in part by the topology of the first organic layer 32. In other words, the holes within the insulating layer 18 are partially filled, and the openings overlie the first organic layer 32 and extend into the holes within the insulating layer 18. In one embodiment, one or more holes in the insulating layer 18 can be used to electrically connect the first organic layer 32 to one or more features below the insulating layer 18. For example, the organic layer 32 can be electrically connected to the first electrode 14 or 16 through one or more holes in the insulating layer 18.

The first organic layer 32 can be selectively formed over the substrate 12. In one embodiment, the first organic layer 32 is conductive and may be formed over the first electrode 14 and the first electrode 16. Within the insulating region 112 the first organic layer 32 may be discontinuous, so that the first electrode 14 is not electrically connected to the first electrode 16. In another embodiment, the first organic layer 32 may be deposited over substantially all of the workpiece 10 and patterned using a conventional of proprietary lithographic technique. In still another embodiment, the first organic layer 32 may not be conductive and may be formed over substantially all of the substrate 12, including substantially all of the insulating region 112.

Figure 5:
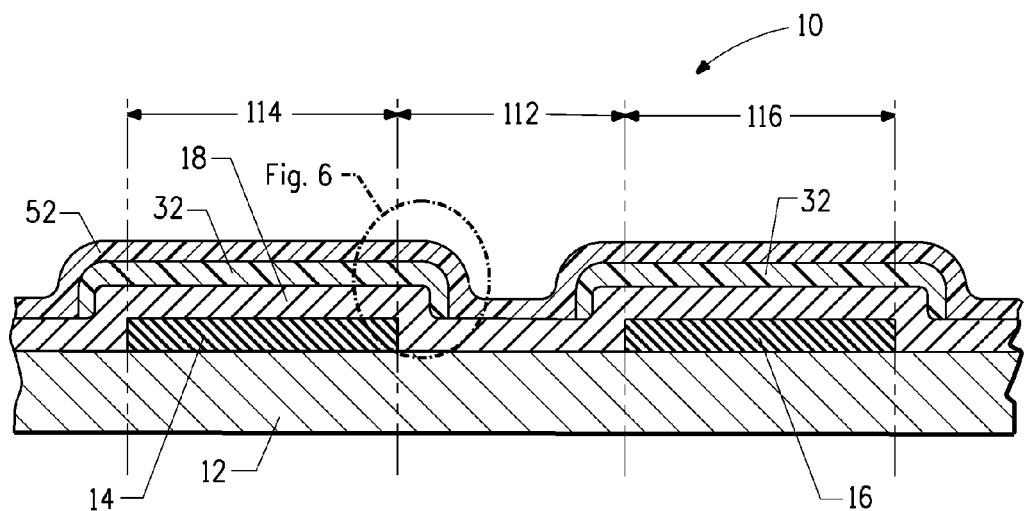
FIGS. 5 and 6 include illustrations of cross-sectional views of the workpiece of FIGS. 3 and 4 after forming an optional portion of the organic layer.
Figure 6:
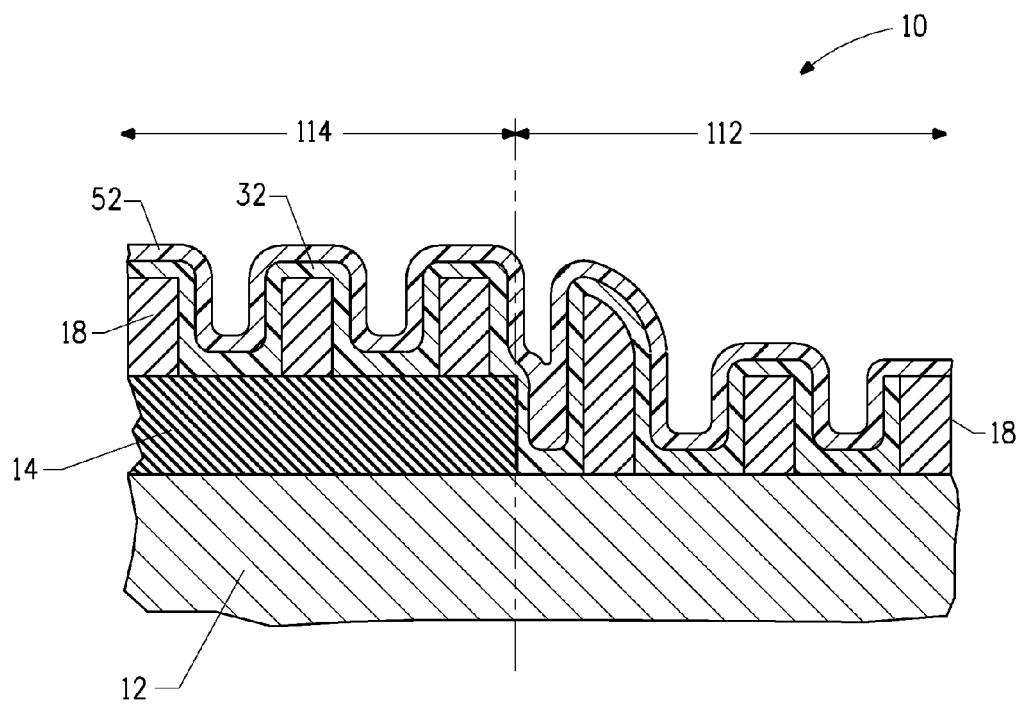

The organic layer can include an optional organic layer 52, as illustrated in FIGS. 5 and 6, that can be formed over the first organic layer 32. FIG. 6 includes an enlarged portion of the workpiece 10 at a region as illustrated by the dashed circle 6 in FIG. 5. In one embodiment, the optional organic layer 52 can act as a hole-injection layer, a hole-transport layer, or an electron-blocking layer. The optional organic layer 52 may be formed by a conventional or proprietary technique used for a hole-injection, hole-transport, or electron-blocking layer. The technique used for the formation of the optional organic layer 52 may be the same or different from that used to form the first organic layer 32. In one particular embodiment, the optional organic layer 52 may be applied with a spin-on process. After formation, the optional organic layer 52 can have a thickness in a range of 5 nm to 300 nm.

The optional organic layer 52 can overlie the first organic layer 32. In a particular embodiment, the optional organic layer 52 can contact the substrate 12 within at least one opening of the insulating layer 18 within the insulating region 112 at a location where the first organic layer 32 is not present. The combined thickness of the first and optional organic layers 32 and 52 within an opening within the insulating layer 18 can be less than the depth of the opening. At this point in the process, the openings corresponding to the holes within the insulating layer 18 are now determined at least in part by the topology of the optional organic layer 52. In other words, the holes within the insulating layer 18 are partially filled, and the openings overlie the optional organic layer 52 and extend into the holes within the insulating layer 18.

Figure 7:
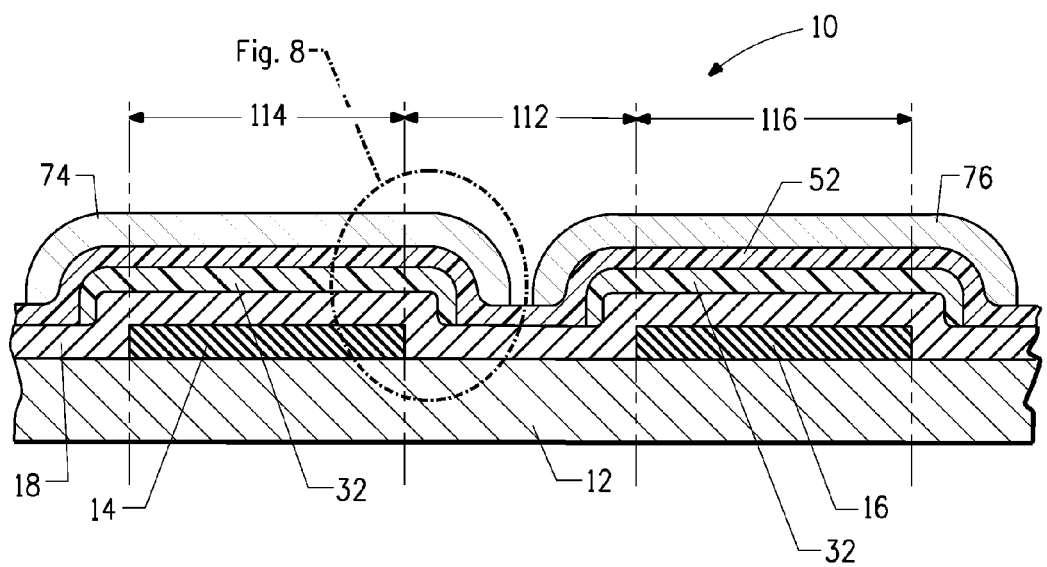
FIGS. 7 and 8 include illustrations of cross-sectional views of a portion of the workpiece after forming an organic active layer.
Figure 8:
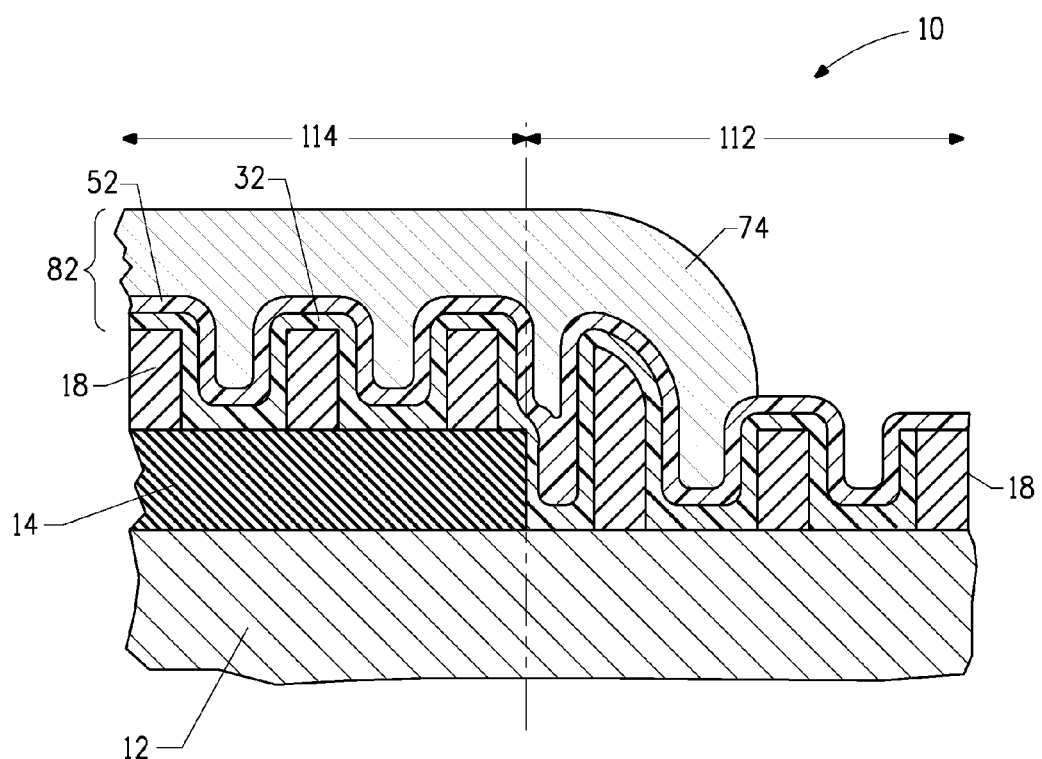

As illustrated in FIGS. 7 and 8, spectral layers 74 and 76 can be formed over the first electrodes 14 and 16, respectively. FIG. 8 includes an enlarged portion of the workpiece 10 at a region as illustrated by the dashed circle 8 in FIG. 7. The spectral layers 74 and 76 can include one or more spectral materials. The organic layer 82 includes the first organic layer 32, optional organic layer 52, and spectral layers 74 and 76.

The spectral layers 74 and 76 can be formed over the first electrodes 14 and 16, respectively, within the radiation regions 114 and 116, respectively. The spectral layers 74 and 76 can be deposited using liquid compositions and a selectively depositing apparatus (e.g., ink-jet printing apparatus, continuous printing apparatus, etc.) previously described.

Figure 9:
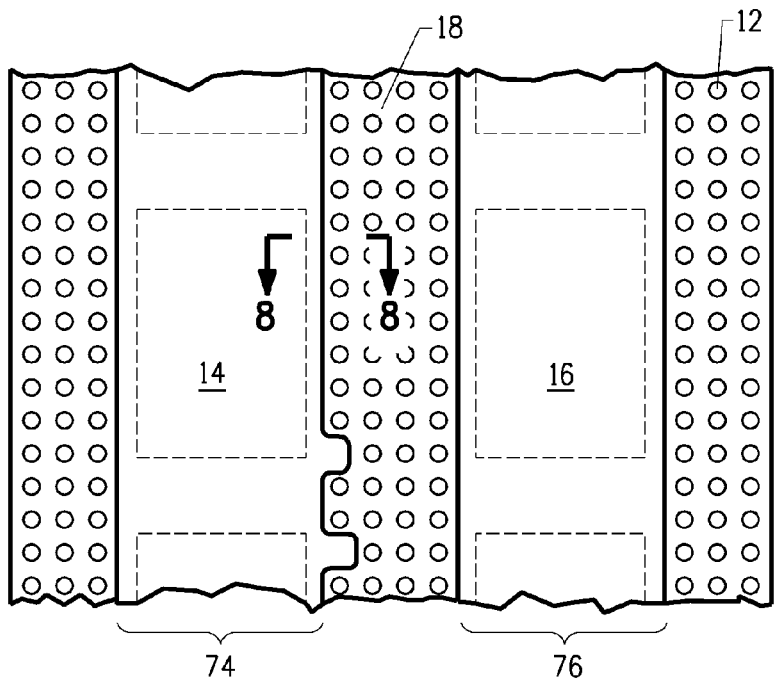
FIG. 9 includes an illustration of a top view of the workpiece of FIG. 7.

In a particular embodiment, illustrated from a top view in FIG. 9, a continuous printing process can be used to form liquid compositions for the spectral layers 74 and 76. In FIG.

9, and elsewhere in this document, some layers have not been illustrated in top-view illustrations to better indicate the relative positions of other features.

During the placement of the liquid composition for the spectral layer 74, the liquid composition can have a first portion within the radiation region 114 and a second portion that lies within the insulating region 112, wherein the second portion substantially fills one or more openings of the plurality of openings. Similarly, the liquid composition for the spectral layer 76 can have a first portion within the radiation region 116 and a second portion within the insulating region 112, wherein the second portion substantially fills one or more openings within the plurality of openings. One or more openings of the insulating layer 18 within the radiation region 114 can be substantially filled by the liquid composition for the spectral layer 74, and one or more openings of the insulating layer 18 within the radiation regions 116 can be substantially filled by the liquid composition for the spectral layer 76.

The liquid composition can be greater than 95% liquid medium by weight. In one embodiment, the depth of the liquid composition for spectral layer 74, 76, or both, at the time of placement can be in a range of approximately 1 micron to approximately 10 microns deep as measured over its corresponding radiation region, and in another embodiment may be in a range of approximately 5 microns to approximately 8 microns deep. In a particular embodiment, the height of the liquid composition can be more than approximately 4 times the height of the insulating layer 18.

The edges of the openings within the insulating layer 18 can provide pinning points for the liquid compositions. The edges of the openings within the insulating layer 18 help to slow the lateral flow of the liquid compositions, thus, reducing the amount of encroachment of the liquid compositions from the radiation regions 114 and 116 into the insulating region 112. The reduced encroachment helps to reduce the likelihood that a spectral material from a radiation region will flow or otherwise migrate into another radiation region in which such spectral material is undesired. In one embodiment, the spectral layer 74 includes a red light-emitting organic material and the spectral layer 76 includes a blue light-emitting organic material. The openings within the insulating layer 18 help to reduce the likelihood that the red light-emitting organic material enters into a region with the blue light-emitting organic material, and thus can help to improve the color control within a pixel.

After the liquid medium within the liquid compositions are evaporated or otherwise substantially removed, remaining portions of the spectral layers 74 and 76 can be at locations previously covered by the respective liquid compositions. For example, a remaining portion of the spectral layer 74 can be formed substantially lying within one or more openings of the insulating layer 18 within the radiation region 114, and a remaining portion of spectral layer 76 can be formed substantially lying within one or more openings of the insulating layer 18 within the radiation region 116. In one embodiment, at least some of the remaining portions of the spectral layers 74 and 76 can substantially fill each of their respective openings. Another remaining portion of spectral layer 74 and another remaining portion of spectral layer 76 can each lie within one or more openings of the insulating layer 18 within the insulating region 112. In another embodiment, at least some of the remaining portions of the spectral layers 74 and 76 can substantially fill each of the respective openings. In one embodiment, as illustrated in FIG. 9, a location between the spectral layers 74 and 76 can have one or more openings within the insulating region 112 that are substantially void of the spectral layers 74 and 76.

The spectral layer 74 can include an organic active layer. The composition of the spectral layer 74 can depend upon the application of the electronic device. In one embodiment, the spectral layer 74 is part of a radiation-emitting component. In a particular embodiment, the spectral layer 74 can include a blue light-emitting material, a green light-emitting material, or a red light-emitting material. The spectral layer 76 can also be an organic active layer and in one embodiment, can be formed for radiation at a different targeted wavelength or spectrum of wavelengths, as compared to the spectral layer 74. For a monochromatic display, spectral layer 76 may have substantially the same composition as spectral layer 74. In another embodiment, a spectral layer that is substantially continuous over substrate 12 (not illustrated) can replace the spectral layers 74 and 76. In another embodiment, the spectral layer 74 may be used in a radiation-responsive component, such as a radiation sensor, photovoltaic cell, or the like. In still another embodiment, the spectral layer 74 can act to filter radiation by either reflecting or absorbing targeted wavelengths or spectra of wavelengths and allowing other wavelengths or spectra of wavelengths to pass.

The spectral layers 74 and 76 can include material(s) conventionally used as organic active layers in organic electronic devices and can include one or more small molecule materials, one or more polymer materials, or any combination thereof. After reading this specification, skilled artisans will be capable of selecting appropriate material(s), layer(s) or both for the spectral layer 74 or potentially other spectral layers. In one embodiment, after formation, the spectral layer 74, 76, or any combination thereof, has a thickness in a range of approximately 40 to 100 nm, and in a more specific embodiment, in a range of approximately 70 to 90 nm. One or more additional spectral layers (not illustrated) may be formed in a similar fashion within other radiation regions.

Although not illustrated, additional layers, such as a hole-blocking layer, an electronic-injection layer, an electron-transport layer, or any combinations thereof may be formed over the spectral layers, such as the spectral layer 74, the spectral layer 76, one or more other spectral layers, or any combinations thereof. The electron-transport layer can allow electrons to be injected from the subsequently formed second electrode (i.e., cathode) and transferred to the spectral layers 74 and 76. The hole-blocking layer, electronic-injection layer, electron-transport layer, or any combinations thereof, typically has a thickness in a range of approximately 30 nm to approximately 500 nm.

In one embodiment, any one or more of the layers within the organic layer 82 may be patterned using a conventional or proprietary technique to remove portions of the organic layer 82 where electrical contacts (not illustrated) are subsequently made. Typically, the electrical contact areas are near the edge of the array or outside the array to allow peripheral circuitry to send or receive signals to or from the array.

5. Remainder of Fabrication

Figure 10:
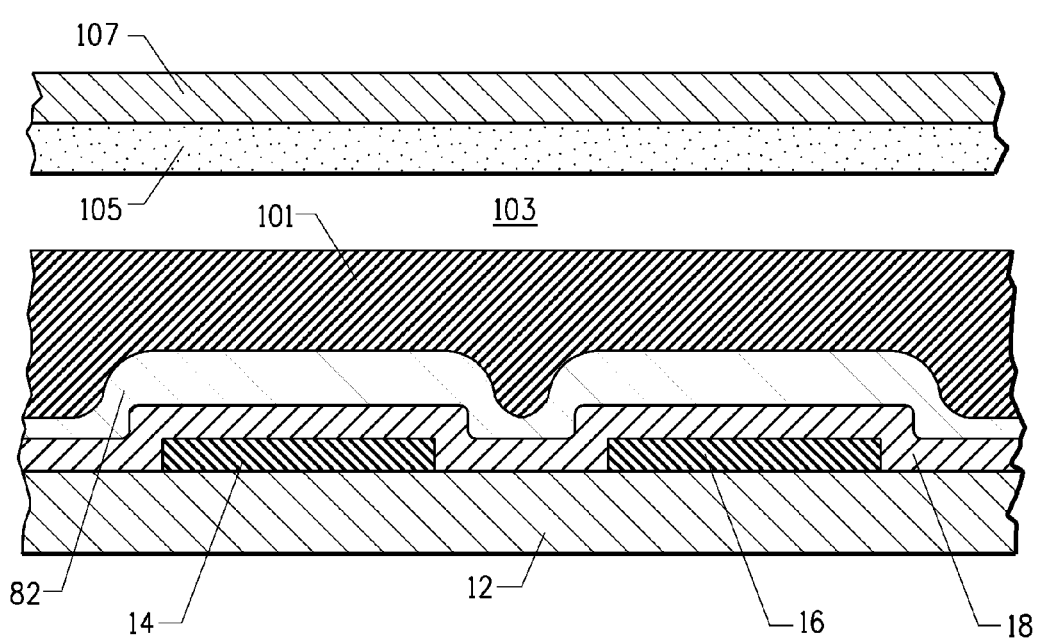
FIG. 10 includes an illustration of a cross-sectional view of a portion of a substantially completed electronic device.

A second electrode 101 is formed over the organic layer 82 as illustrated in FIG. 10. In one embodiment, the second electrode 101 can act as a cathode. An array of the electronic device can have one or more common cathodes, wherein each common cathode is shared by a plurality of electronic components. In still another embodiment (not illustrated), the second electrode 101 can include one cathode for each electronic radiation-emitting or radiation-responsive component within the array.

In one embodiment, the second electrode 101 can include a low work function layer and a conductive layer that helps to provide good conductivity. The low work function layer can include a Group 1 metal (e.g., Li, Cs, etc.), a Group 2 (alkaline earth) metal, a rare earth metal, including the lanthanides, the actinides, a corresponding oxide or halogenide (such as LiF, $Li_2O$, BaO, etc.), an alloy including any of the foregoing metals, or any combination thereof. A conductive polymer with a low work function may also be used. The conductive layer may include nearly any conductive material, including those previously described with respect to the electrodes 14 and 16. The conductive layer is used primarily for its ability to allow current to flow while keeping resistance relatively low. An exemplary material for the conductive layer includes aluminum, silver, copper, or any combination thereof.

The second electrode 101 can be formed using any one or more of the formation techniques described with respect to the electrode 14. In many applications, the thickness of the second electrode 101 may be in a range of approximately 5 nm to approximately 500 nm. If radiation is not to be transmitted through second electrode 101, the upper limit on the thickness may be greater than 500 nm.

Other circuitry, not illustrated, may be formed using any number of the previously described or additional layers. Although not illustrated, additional insulating layer(s) and interconnect level(s) may be formed to allow for circuitry in peripheral areas (not illustrated) that may lie outside the array. Such circuitry may include row or column decoders, strobes (e.g., row array strobe, column array strobe, or the like), sense amplifiers, or any combination thereof.

A lid 107 with a desiccant 105 is attached to the substrate 12 at locations (not illustrated) outside the array to form a substantially completed electronic device. A gap 103 may or may not lie between the second electrode 101 and the desiccant 105. The materials used for the lid and desiccant and the attaching process are conventional or proprietary. The lid 107 typically lies on a side of the electronic device opposite the user side of the electronic device. Still, if desired, radiation may be transmitted through the lid 52 instead of or in conjunction with the substrate 12. If so, the lid 107 and the desiccant 105 can be designed to allow sufficient radiation to pass through.

In other embodiments, the first and second electrodes can be reversed. In this embodiment, the second electrode 101 would lie closer to the user side of the substrate 12, as compared to the first electrodes 14 and 16. The second electrode 101 could include a plurality of second electrodes that are each connected to control circuits (not illustrated). Also, a common first electrode could replace the first electrodes 14 and 16. In still another alternative embodiment, the control circuits may be connected to one type of electrode that lies farther from the substrate 12 as compared to the other type of electrode.

6. Alternative Embodiments

Figure 11:
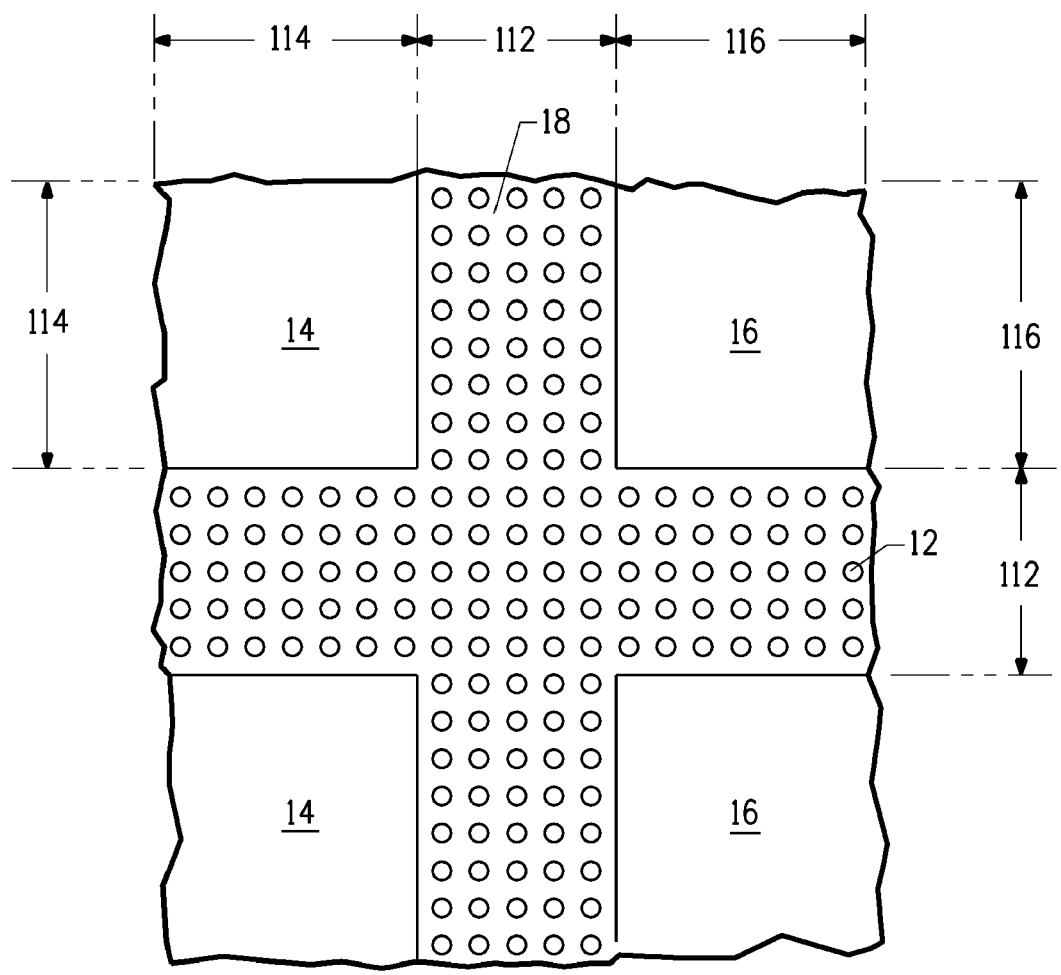
FIG. 11 includes an illustration of a top view of a portion of a workpiece according to an alternative embodiment, wherein a portion of the insulating layer overlying first electrodes 14 and 16 has been removed.

FIG. 11 includes an illustration of an alternative embodiment that is formed in a manner similar to the process described in Section 3 above except that portions of the insulating layer 18 overlying the first electrodes 14 and 16 have been removed such that there is a single opening overlying each of the first electrodes 14 and 16. Processing can proceed as previously described. One or more openings within the insulating layer 18 can still provide a pinning point for a liquid composition.

Figure 12:
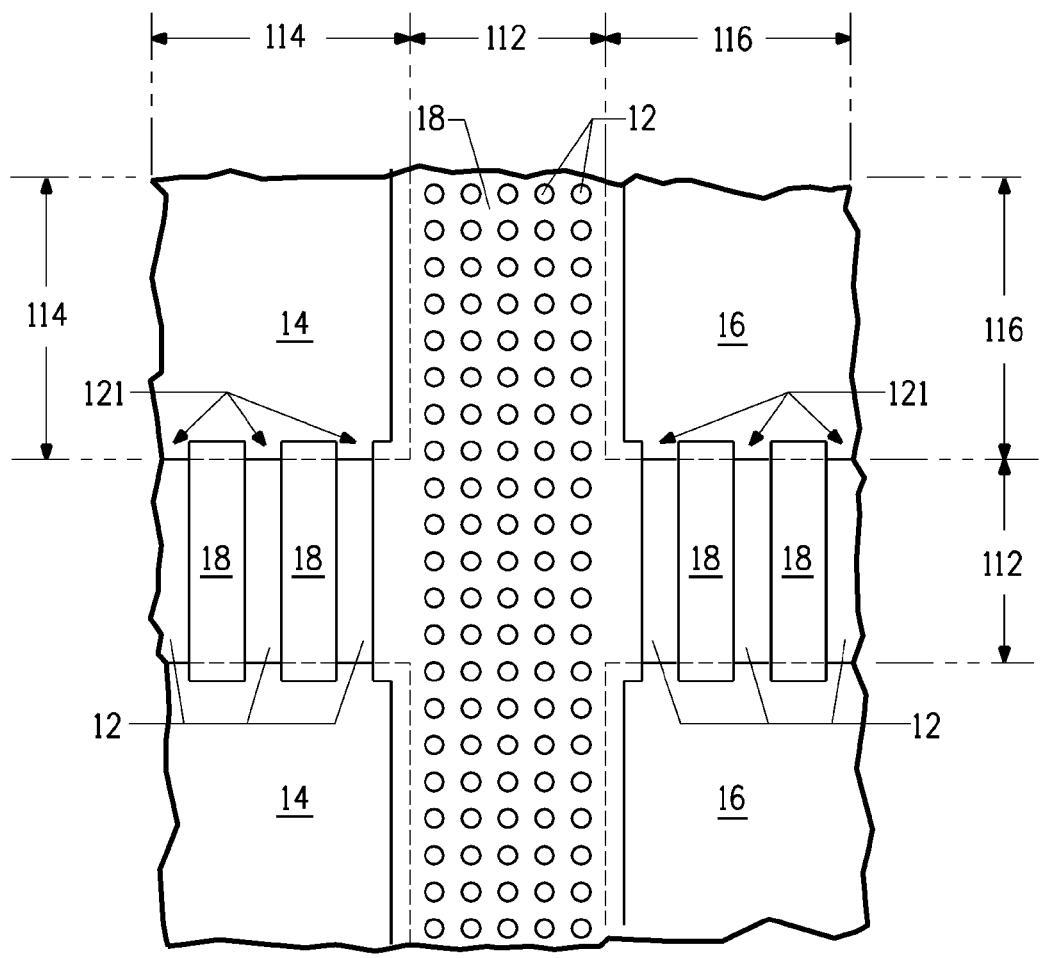
FIG. 12 includes an illustration of a top view of a portion of the workpiece according to an alternative embodiment, wherein channels are formed between some of the openings along the path of a subsequent continuous printing process.

FIG. 12 includes an illustration of another alternative embodiment that is formed in a manner similar to the process described in Section 3 above except that in addition to the openings over the first electrodes 14 and 16, as illustrated in FIG. 11, channels 121 have been formed by patterning portions of the insulating layer 18 between adjacent electrodes 14 along the intended flow direction of the continuous printing process. Portions of the substrate 12 are exposed along bottoms of the channels 121. Such a pattern can help improve the flow of the liquid compositions for the spectral layers. In one embodiment, the portions of the insulating layer 18 lying between the electrodes 14 can be removed entirely such that a continuous opening is formed along the intended path of a continuous printing process.

Figure 13:
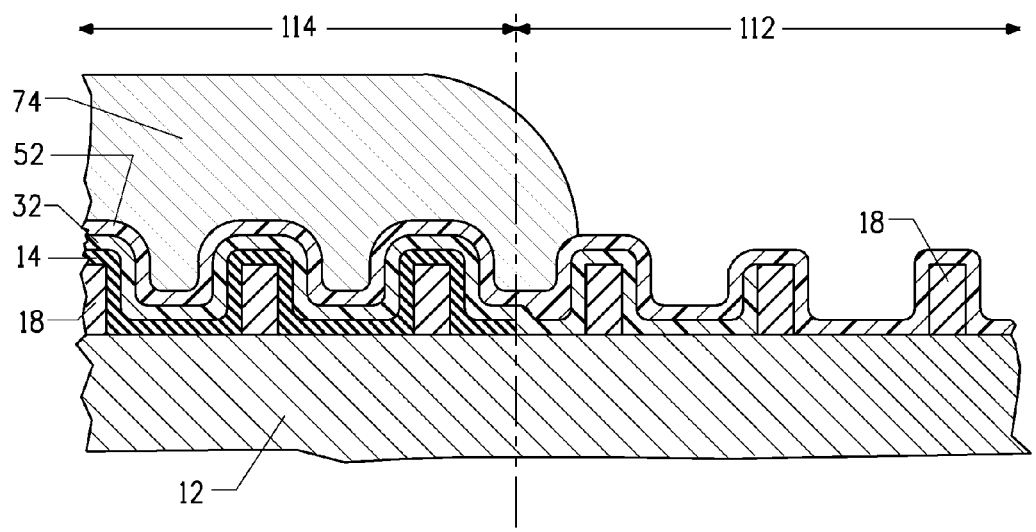
FIG. 13 includes an illustration of a cross-sectional view of a portion of the workpiece according to an alternative embodiment, wherein the plurality of openings is formed prior to formation of the first electrode.

FIG. 13 includes an illustration of another alternative embodiment that is formed in a manner similar to the process described in Section 3 above except that the insulating layer 18 and the plurality of openings therein are formed prior to formation of the first electrode 14. In a particular embodiment, the first organic layer 32 can help to electrically connect different portions of the first electrode 14.

In another embodiment (not illustrated), the insulating layer 18 is not formed and the openings are formed within a portion of the substrate 12. The depth, size, shape, and spacing of the openings extending into the substrate 12 can be in a range as previously described with respect to the openings as initially formed within the insulating layer 18. In an even more particular embodiment, the openings in substrate 12 have a substantially uniform depth.

In another embodiment (not illustrated), one or more additional layers with significantly different refractive index(ices) from insulating layer 18 can be formed within one or more openings of the plurality of openings. Such a structure can help to reduce the wave guiding effect of radiation within the electronic device. In one embodiment, a portion of such an additional layer on a sidewall of an opening could affect the amount of light trapped within insulating layer 18. For example, if insulating layer 18 includes silicon dioxide ($\eta$ of approximately 1.45), the additional layer could include silicon nitride ($\eta$ of approximately 2.0), polysilicon ($\eta$ of approximately 3.0), a fluoropolymer ($\eta$ of approximately 1.6 to 1.8), or any combinations thereof. As the difference in refractive indices between the insulating layer 18 and the one or more optional layers increases, the ability to redirect the radiation toward the user surface improves.

In another embodiment, the one or more additional layers may include a portion along a bottom of an opening and act as a micro lens. The portion can gather light and affect how it projects to the user surface for a radiation-emitting component. In another embodiment, the portion can help redirect ambient radiation from outside the electronic device to a radiation-responsive layer (e.g., an organic active layer) within a radiation-responsive component. In a particular embodiment, refractive index(ices) of the one or more additional layers may be the same or different as compared to the insulating layer 18.

With respect to process integration using the one or more additional layers, the one or more additional layers with some embodiments may be formed using additional processing, such as removing a portion of the material from along a bottom of the opening so that the opening can serve as an electrical connection between layers. For example, when insulating layer 18 overlies the anode, an additional patterning and etch operation may be used to remove a portion of the one or more additional layers to allow electrical connection between the first organic layer 32 and each of the first electrodes 14 and 16. After reading this specification, skilled artisans will appreciate that the one or more additional layers can be used with respect to other embodiments, some of which are described in this specification.

Figure 14:
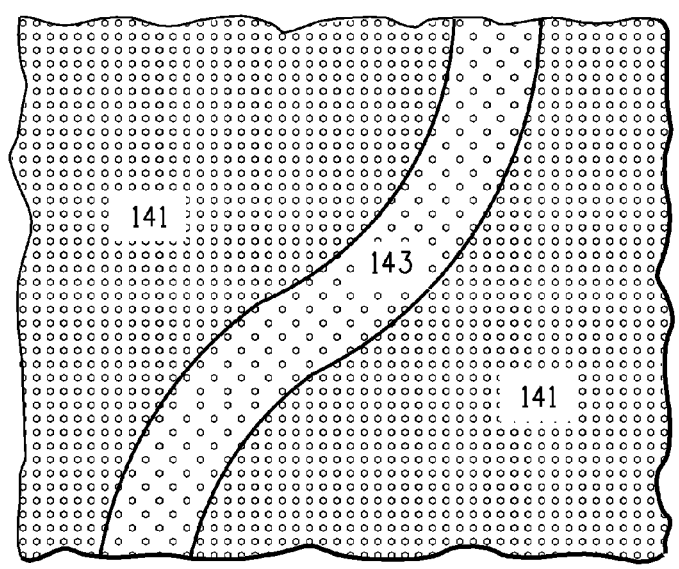
FIG. 14 includes an illustration of a top view of a surface with two regions according to an alternative embodiment.

FIG. 14 includes an illustration of a top view of another alternate embodiment of in which a layer has different regions. The region 141 includes a first plurality of openings and the region 143 includes a second plurality of openings. The first plurality of openings within region 141 may be at a higher opening density as compared to the second plurality of openings within 143. A liquid composition deposited over the layer may preferentially flow within the region 143 because of the lower density of openings and fewer pinning points, as compared to the region 141. The ability of a liquid composition to spread across an area with fewer pinning points can be less restrained than flow across an area with more pinning points. In another embodiment, the density of openings within the regions 141 and 143 could be reversed to allow easier flow within the region 141 as opposed to the region 141. In still another embodiment, the region 141 can include a density of openings, and the region 143 can include a channel that includes more than one change in direction along the length of the channel.

Figure 15:
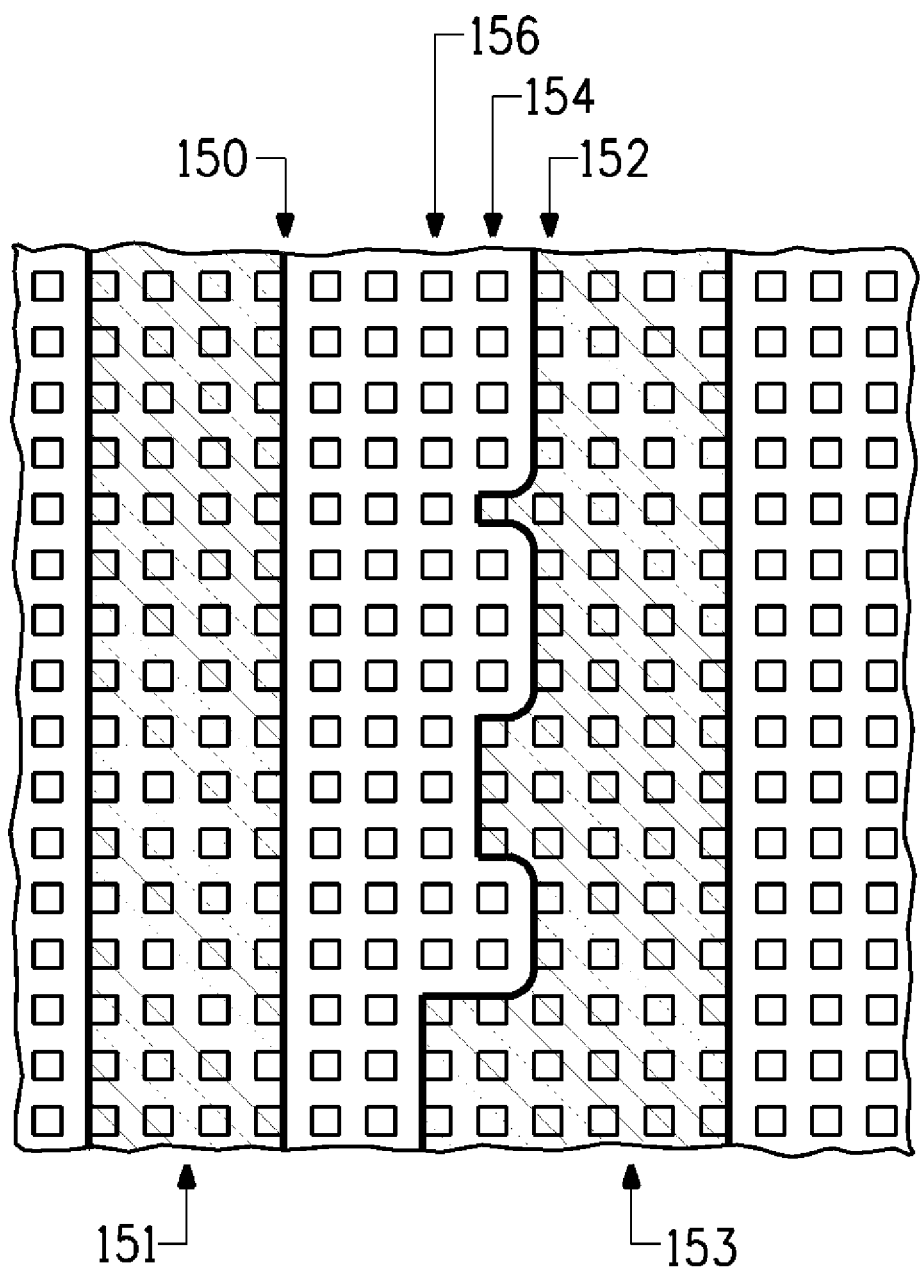
FIG. 15 includes an illustration of a top view of a surface including an edge of a continuously printed feature aligned to edges of openings in different rows of an array of openings.

In one embodiment, the plurality of openings can form a regular pattern such as a plurality of openings in a rectangular grid as illustrated in FIG. 15. Continuous printing along a direction of the grid can form printed lines at locations 151 and 153. The edges of lines printed in this manner can tend to align with rows of the grid. For example, at location 151, a substantially straight line with substantially straight edges can be printed. In one embodiment, the right-hand edge of the line is substantially aligned along a first row 150 of openings. In another example, at location 153, another line is also printed that is substantially oriented along a vertical direction in FIG. 15. However, the left-hand edge of that line is not straight, as a portion of the left-hand edge can be aligned substantially along a second row 152 of the openings within the grid and other portions can be aligned substantially along other rows of openings within the grid such as a third row 154 of openings or a fourth row 156 of openings. After reading this specification, skilled artisans will appreciate that other shapes of openings (e.g., circles) may be used instead of or in conjunction with squares as illustrated in FIG. 15.

In still another embodiment, the openings within a layer may be in the form of a roughened surface. Instead of using a patterning layer, an abrasion technique (e.g., "sandblasting") can be used to roughen the surface of the substrate 12 to produce irregularly shaped openings. Such openings can still help to reduce intended lateral flows of liquid compositions. In still another embodiment, a layer may be deposited and appear as a roughened layer. For example, a vapor phase deposition can be operated such that gas phase nucleation occurs before reaching and depositing onto a surface of the workpiece 10. The process can form clusters of material that may be discontinuous in at least some regions or provide an irregular surface (similar to a roughened surface as previously described).

The concepts described herein can be used to affect layer(s) that are not designed to emit, respond, or filter radiation. Such an application may be used to form a circuit element including a transistor, a resistor, a capacitor, a diode or any combination thereof. Note that any of these electronic components may be used in logic, amplifying, or another circuit and may or may not be used for their radiation-related properties.

7. Advantages

After reading this specification, skilled artisans will appreciate placement of liquid compositions can be more accurately controlled by creating a plurality of openings in a surface prior to applying the liquid composition. This can allow the formation of displays with smaller than previously possible pixel size without the need to buy new equipment or create new formulations of liquid compositions. For example, a liquid composition can be printed to a width as narrow as approximately 40 microns when using the insulating layer 18 with the openings. If the insulating layer 18 with the openings is not used, the same liquid composition may not be printed to a width narrower than approximately 80 microns. Smaller widths allow for a higher pixel density and better resolution within a display.

Use of this process can also reduce the need for banks or other physical containment structures for the liquid composition during the deposition process. Fluorination or other activities or materials to reduce surface energy may also be eliminated. Still further, a receiving layer for the liquid composition is also not required. Elimination of banks or other containment structures, fluorination or other activities or materials, a receiving layer, or any combination thereof reduces the number of manufacturing operations. Still, any of the banks or other containment structures, fluorination or other activities or materials, a receiving layer, or any combination thereof can be used if desired.

In some embodiments, insulating layer 18 can help improve the radiation emission from or collection within the electronic device. Such an improvement can increase the amount of radiation reaching the user surface of the electronic device or the amount of radiation received by one or more electronic components within the electronic device without changing the electronic operating parameters of the electronic device (e.g., voltage, current, etc.).

Example

Figure 16:
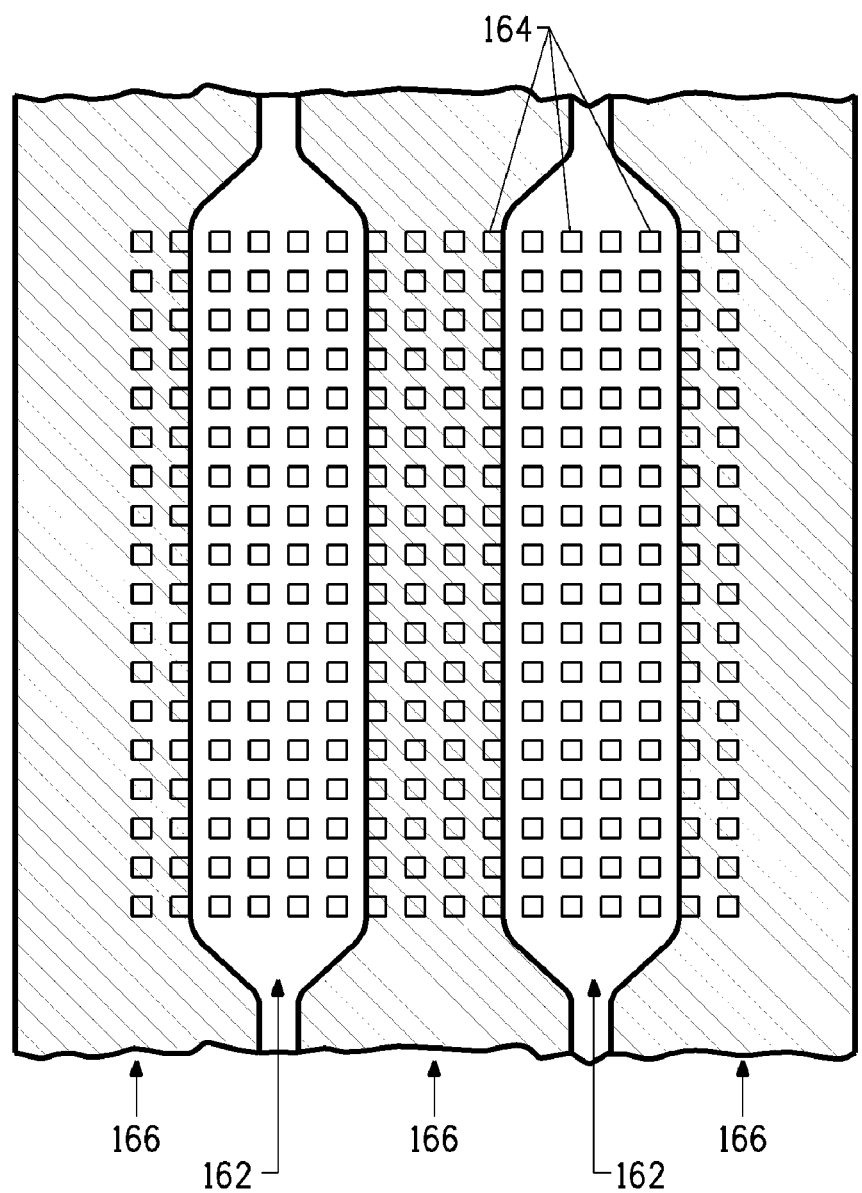
FIG. 16 includes an illustration of a top view of an example of a continuously printed line overlying a region containing a plurality of openings.

The following specific example is meant to illustrate and not limit the scope of the invention. This example demonstrates that the appropriate manipulation of one or more physical properties of an insulating layer and a liquid composition can provide an electronic component in an electronic device without the need for a bank or well structure. The description below refers to FIG. 16.

Electronic components are fabricated to include the following structure: ITO or IZO (first electrodes or anodes)/silicon dioxide or silicon nitride layer including plurality of openings/buffer layer/organic active layer/second electrode (cathode). The substrate is 30 mm×30 mm (nominal) ITO coated glass. The charge-transport layer is a PEDOT material (BAYTRON-P™, Bayer AG, Germany). The organic active layer includes a red light-emitting polyfluorene material (a material capable of emitting red light). A thin continuous SiN or $SiO_2$ layer 162 of less than 1000 nm thickness is deposited overlying the first electrodes and patterned using photolithography to form a plurality of substantially square via openings 164 of approximately 10 microns×approximately 10 microns in a rectilinear pattern. Organic active layer 166 is printed overlying a portion of the openings 164 and extending onto the SiN or $SiO_2$ layer using the same conditions for printing. The ratio of the printed line with is measured at approximately 40 microns over the area with via openings and approximately 80 microns over an area without via openings or a well structure. After reading this specification, skilled artisans will appreciate that other shapes of openings (e.g., circles, not illustrated) may be used instead of or in conjunction with the squares illustrated in FIG. 16.

Note that not all of the activities described above in the general description or the examples are required, that a portion of a specific activity may not be required, and one or more that further activities may be performed in addition to those described. Still further, the order in which activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that one or more modifications or one or more other changes can be made without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more, problems, or any combination thereof has been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

What is claimed is:

1. A process for forming an electronic device, the process comprising:
    patterning an insulating layer, wherein;
        the patterned insulating layer defines a plurality of openings within the insulating layer; and
        an opening of the plurality of openings lie within an insulating region, the insulating region having a first side and a second side opposite the first side, wherein:
            a first radiation region lies immediately adjacent to the first side;
            a second radiation region lies immediately adjacent to the second side; and
            within an insulating region, no other radiation region lies between the first and the second sides of a radiation region;
    forming a first liquid composition at a first location overlying a substrate, wherein the first liquid composition includes a first portion and a second portion, wherein:
        the first portion of the first liquid composition lies within the first radiation region;
        the second portion of the first liquid composition substantially fills a first opening of the plurality of openings; and
        substantially none of the first liquid composition is formed within a second opening of the plurality of openings.

2. The process of claim 1, wherein during formation of the first liquid composition, a thickness of the first liquid composition layer is at least four times a depth of the first opening.

3. The process of claim 1, further comprising forming a second liquid composition at a second location overlying the substrate, such that the second liquid composition substantially fills a third opening of the plurality of openings.

4. The process of claim 3, wherein a portion of the patterned insulating layer comprising the second opening lies between the first location and the second location.

5. The process of claim 4, wherein substantially none of the second liquid composition is formed within the second opening.

6. The process of claim 1, wherein forming the first liquid composition comprises continuously printing the first liquid composition.

7. The process of claim 6, wherein the first liquid composition includes a spectral material.

8. The process of claim 1, wherein patterning the insulating layer further comprises forming at least one opening extending through the insulating layer.

9. The process of claim 1, wherein patterning the insulating layer and forming at least the first liquid composition at the first location results in an array of insulating regions and an array of radiation regions.

10. The process of claim 1, wherein each of the first side and the second side of an opening have a length no greater than 40 microns.

11. The process of claim 9, wherein each of the first side and the second side of an opening have a length no greater than 40 microns.

* * * * *